US006815736B2

(12) United States Patent
Mascarenhas

(10) Patent No.: US 6,815,736 B2
(45) Date of Patent: Nov. 9, 2004

(54) ISOELECTRONIC CO-DOPING

(75) Inventor: Angelo Mascarenhas, Lakewood, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/841,691

(22) Filed: Apr. 24, 2001

(65) Prior Publication Data

US 2002/0117675 A1 Aug. 29, 2002

(51) Int. Cl.[7] .......................................... H01L 31/0304
(52) U.S. Cl. ...................... 257/201; 257/184; 257/103; 136/249; 136/262
(58) Field of Search ............................... 257/103, 184, 257/201, 102; 136/249, 262

(56) References Cited

U.S. PATENT DOCUMENTS

| | | | |
|---|---|---|---|
| 4,284,962 A | 8/1981 | Esterowitz et al. | 331/94.5 F |
| 4,400,221 A | 8/1983 | Rahilly | 148/1.5 |
| 4,591,654 A | 5/1986 | Yamaguchi et al. | 136/252 |
| 4,939,103 A | 7/1990 | Szolgyemy | 437/151 |
| 5,028,561 A | 7/1991 | Kamath et al. | 437/105 |
| 5,116,455 A | 5/1992 | Daly | 156/605 |
| 5,158,896 A | 10/1992 | Burroughes et al. | 437/5 |
| 5,231,298 A | 7/1993 | Daly | 257/191 |
| 5,344,791 A | 9/1994 | Huang | 437/126 |
| 5,387,544 A | 2/1995 | Hayafuji | 437/151 |
| 5,422,731 A * | 6/1995 | Beneking | 257/609 |
| 5,453,404 A | 9/1995 | Leedy | 437/203 |
| 5,728,231 A | 3/1998 | Negami et al. | 148/33 |
| 5,776,793 A | 7/1998 | Lee et al. | 438/35 |
| 5,895,225 A | 4/1999 | Kidoguchi et al. | 438/47 |
| 5,963,571 A | 10/1999 | Wingreen | 372/45 |
| 5,986,288 A | 11/1999 | Hasegawa | 257/94 |
| 6,002,202 A | 12/1999 | Meyer et al. | 313/420 |

OTHER PUBLICATIONS

Oe, K. and Okamoto, H., "New Semiconductor Alloy $AgAs_{1-x}Bi_x$ Grown by Metal Organic Vapor Phase Expitaxy", *Japanese Journal of Applied Physics*, vol. 37, pp. L1283–L1285, Nov. 1998.

Yamamoto, T. and Katayama–Yoshida, H., "Solution Using a Codoping Method to *Unipolarity* for the Fabrication of ρ–Type ZnO", *Japanese Journal of Applied Physics, vol. 38, pt. 2, No. 2B, pp. L166–L169, Feb. 1999.*

Ploog, K.H. and Brandt, O., "Doping of group III nitrides", *Journal of Vacuum Society Technology A*, vol. 16, No. 3, p. 1609, Aug. 1998.

Yamamoto, T. and Katayama–Yoshida, H. "Role of Clor I Codoping in Li–Doping Enhancement in ZnSe", *Japanese Journal of Applied Physics*, Pt. 2, No. 8A, pp. L910–L912, Aug. 1998.

Brandt, O.; Yang, H.; Kostial, H.; and Ploog, K.H., "High ρ–type condicutivity in cubic GaN/GaAs(113)*A* by using Be as the acceptor and O as the codopant", *Applied Physics Letters*, vol. 69, No. 18, pp. 2707–2709, Oct. 1996.

(List continued on next page.)

Primary Examiner—Jerome Jackson
(74) Attorney, Agent, or Firm—Paul J. White

(57) ABSTRACT

Isoelectronic co-doping of semiconductor compounds and alloys with deep acceptors and deep donors is used to decrease bandgap, to increase concentration of the dopant constituents in the resulting alloys, and to increase carrier mobilities lifetimes. Group III–V compounds and alloys, such as GaAs and GaP, are isoelectronically co-doped with, for example, N and Bi, to customize solar cells, thermal voltaic cells, light emitting diodes, photodetectors, and lasers on GaP, InP, GaAs, Ge, and Si substrates. Isoelectronically co-doped Group II–VI compounds and alloys are also included.

169 Claims, 10 Drawing Sheets

OTHER PUBLICATIONS

Pankove, J.I.; Torvid, J.T.; Qui, C.–H.; Grzegory, I.; Porowski, S.; Qui, C.-H.; Grzegory, I.; Porowski, S.; Quigley, P.; Martin, B., "Molecular Doping of Gallium Nitride", *Applied Physics Letters*, vol. 74, No. 3, pp. 416–418, Jan. 1999.

White, C.W.; Budai, J.D.; Zhu, J.G; and Withrow, S.P., "Ion–beam systhesis and stability of GaAs Nanocrystals in silicon", *Applied Physics Letters*, vol. 68, No. 17, pp. 2389–2391, Apr. 1996.

Withrow, S.P.; Holland, O.W.; Pennycook, S.J.; Pankeve, J.; and Mascarenhas, A., "Beam–Solid Interactions: Physical Phenomena", *Materials Research Society Symposium Proceedings*, vol. 157, pp. 143–148, (1990).

Kuznetsov, V.V.; Pikhtin, A.N.; Razbegaev, V.N.; and Sorokin, V.S., "High–temperature luminescence of GaP: Bi:N", *Sov. Phys. Semicond.*, 14(4), pp. 417–419, Apr. 1980.

Trumbore, M.; Gershenzon, M.; amd Thomas, D.G., "Luminescence due to the Isoelectronic Substitution of Bismuth for Phosphorus in Gallium Phosphide", *Applied Physics Letters*, vol. 9, No. 1, pp. 4–6, Jul. 1996.

Thomas, D.G. and Hopfield, J.J., "Isoelectronic Traps Due to Nitrogen in Gallium Phosphide," Physical Review, vol. 150, No. 2, Oct. 14, 1966, pp. 680–689.

* cited by examiner

VCSEL
Lasers for 1.3 or 1.55 μm

ISOELECTRONIC CO-DOPING

CONTRACTUAL ORIGIN OF THE INVENTION

The United States Government has rights in this invention under Contract No. DE-AC36-99GO10337 between the United States Department of Energy and the National Renewable Energy Laboratory, a Division of the Midwest Research Institute.

BACKGROUND OF THE INVENTION

1. Field of the Invention

The present invention is related generally to formulation and fabrication of doped semiconductor materials and more specifically to isoelectronic co-doping of semiconductor materials.

2. Description of the State of the Art

It is conventional to formulate and fabricate semiconductor materials by doping crystal lattice materials whereby a small amount of an element belonging to one column on the periodic table of the elements, i.e., one number of conduction or outer shell electrons, is replaced with a small amount of material from a different column or group on the periodic table, i.e., a different number of conduction or outer shell electrons, usually one column or group removed, i.e., one more or one fewer outer shell electrons. For example, silicon (a group IV material) is often doped with a small amount of boron (a group III material) to make electronic devices. It is also conventional to use various alloys to form the semiconductor material, i.e., substitutions on lattice sites by elements from the same group in the periodic table, to obtain whatever semiconductor characteristics are needed or desired, such as band gap, crystal lattice constant, mobility, and the like. Solar cells and light emitting semiconductors are usually made with semiconductor materials that have direct bandgaps (i.e., no change in momentum is required for an electron to cross the bandgap between the valence and the conduction energy bands). There have been, and still are, a number of attempts to fabricate solar cells, photodiodes, and light emitting semiconductors using silicon, which is an indirect bandgap material, to open the possibility of combining the benefits of silicon integrated circuits with the energy and communications capabilities of light, but such efforts have seen only limited success.

In the solar cell realm, there are many efforts to obtain a semiconductor material with a bandgap close to 1.0 eV and that is compatible with, i.e., lattice matched to, other semiconductor materials with higher and lower bandgaps to form an integral component of a monolithic quadruple junction solar cell. For example, it is known from mathematical modeling that, for optimum energy absorption from the solar spectrum using four discrete solar cells, the four discrete cells should have bandgaps in the sequence of 1.9 eV, 1.42 eV, 1.05 eV, and 0.67 eV, respectively. Such a monolithic, four-junction, 1.9 eV/1.42 eV/1.05 eV/0.67 eV solar cell structure could attain solar energy conversion efficiency of forty percent (40%) AM1. As mentioned above, solar cells are usually made of group III and group V semiconductor materials, such as gallium (Ga) and arsenic (As), which have direct bandgaps that facilitate absorption and conversion of light energy to electricity and because GaAs wafers for use as lattice matched substrates are readily available. Such group III and group V semiconductor materials with bandgaps at or near the 1.9 eV and 1.42 eV levels with good electric device qualities have been available for some time, e.g., InGaP (1.90 eV) and GaAs (1.42 eV). Germanium (Ge) with a bandgap of 0.67 eV, while it is a group IV material, can never-the-less be used for the substrate part of a monolithic, quadruple junction solar cell, because the substrate can be made thick enough to absorb light energy in spite of the indirect bandgap.

However, making a light absorbent, semiconductor material for the 1.05 eV bandgap cell has been an elusive goal. While 1.05 eV bandgap materials can be made, there have not been any suitable 1.05 eV bandgap materials that have acceptable carrier mobilities and other electronic properties and that can be lattice-matched to the other semiconductor materials for the other cell junctions, as discussed above, such as GaAs and Ge.

Among the semiconductor materials systems that have been investigate for a suitable 1.05 eV cell layer is GaInNAs. The interest in this system was sparked initially y the surprising observation by Weyers et al, *Jpn. J. Appl. Physics* 31(1992) pp. L853, that the dilute alloy $GaAs_{1-x}N_x$ has a giant conduction band bowing, Neugebauer, et al, *Phys. Rev. B.* 51(1995) pp. 10568, and then by the demonstration by Kondow et al., in 1996 that the quaternary alloy $Ga_{0.92}In_{0.08}N_{0.03}As_{0.97}$ could be grown lattice matched to GaAs with a b gap of 1.0 eV *J Cryst. Growth* 164 (1996) pp. 175. The 8% In was used by Kondow et al., al ng with the Ga, As, and N, to achieve lattice matching with a GaAs substrate. However, the photoluminescense of $Ga_{0.92}In_{0.08}N_{0.03}As_{0.97}$ is poor. In spite of dilute $GaAs_{1-x}N_x$ having the desired 1.0 eV bandgap and the ability to lattice match it to GaAs by the addition of In to the alloy, the very poor electron mobilities in such dilute $GaAs_{1-x}N_x$ based alloys has inhibited an further significant progress toward using such an alloy in a photoelectric device, such a monolithic, quadruple junction, solar cell.

SUMMARY OF THE INVENTION

Accordingly, a specific object of this invention is to modify a dilute $GaAs_{1-x}N_x$ alloy in a manner that not only maintains a bandgap close to 1.05 eV and is lattice matched to GaAs, but also that increases the electronic device quality of the alloy enough to make it not only useful, but also beneficial, as a solar cell semiconductor material.

A more general object of this invention is to expand the repertoire for available choices of semiconductor compounds and alloys that have bandgap/lattice constant paired values suited for expitaxial growth of device structures that implement design principles closest to the ideal.

Another specific object of this invention is to tailor semiconductor materials, such as GaP, to have bandgaps that are close to optimum solar radiation absorption for two junction and three junction tandem solar cells while also being lattice matched to silicon substrates.

Another specific object of this invention is to fabricate and tailor semiconductor materials for active layers of LED's and laser diodes with bandgaps that produce light in wavelengths that are particularly suitable for fiber optic transmission, such as 1.55 μm or 1.3 μm and which are lattice matched to common semiconductor substrate materials, such as Si or GaAs.

A further specific object of this invention is to fabricate and tailor semiconductor materials for LED's or laser diodes to have bandgaps that produce certain specific colors of light in the red and near infra-red wavelength regions and that are lattice matched to common semiconductor substrate materials, such as Si, GaAs, and GaP.

Yet another object of this invention is to fabricate and tailor semiconductor materials with bandgaps that absorb infrared radiation to produce electricity and that are lattice matched to desired substrate materials, such as InP.

Additional objects, advantages, and novel features of the invention are set forth in part in the description that follows and will become apparent to those skilled in the art upon examination of the following description and figures or may be learned by practicing the invention. Further, the objects and the advantages of the invention may be realized and attained by means of the instrumentalities and in combinations particularly pointed out in the appended claims.

To achieve the foregoing and other objects and in accordance with the purposes of the present invention, as embodied and broadly described herein, a method of this invention may comprise modifying a semiconductor compound or alloy comprising host atoms in a crystal lattice to have a lower bandgap than the bandgap of the semiconductor compound or alloy prior to such modification. Such bandgap lowering can be achieved by isoelectronically co-doping the semiconductor compound or alloy with a first isoelectronic dopant comprising atoms that form isoelectronic traps in the host crystal lattice, which behave as deep acceptors, and with a second isoelectronic dopant comprising atoms that form isoelectronic traps in the host crystal lattice, which behave as deep donors. For example, a semiconductor material with a host crystal lattice comprising Group III and V host atoms, such as GaAs with a bandgap of 1.42 eV, can be isoelectronically co-doped with N and Bi to lower the bandgap to anything between 1.42 eV and about 0.8 eV. Other examples include isoelectronically co-doping GaP with N and Bi, InP with N and Bi, GaInP with N and Bi, InGaAs with N and Bi. Other combinations are also feasible.

This ability to modify bandgaps of semiconductor alloys without adversely affecting carrier mobilities and other properties provides the ability to fabricate material with desired bandgaps that can also be lattice matched to substrate and other semiconductor materials where such combinations of lattice matching and desired bandgaps were not available prior to this invention. Accordingly, this invention includes semiconductor devices, such as solar cells and LED's or laser diodes that have not been available before this invention. For example, a monolithic, quadruple junction solar cell, according to this invention, may include a first or bottom cell comprising Ge with a bandgap of about 0.67 eV, a second cell comprising GaAs that is isoelectronically co-doped GaAs:N:Bi with a bandgap of about 1.05 eV, a third cell comprising GaAs with a bandgap of about 1.42 eV, and a fourth or top cell comprising InGaP with a bandgap of about 1.90 eV. This structure can be fabricated on either a Ge or GaAs substrate, if desired. Other examples include isoelectronically co-doped GaP in one or more cells, such as GaP:N:Bi (bandgap of 1.75 eV) or a combination of GaP:N:Bi (bandgap of 1.55 eV) and GaP:N:Bi (bandgap of 2.04 eV) fabricated on a Si substrate and junction (bandgap of 1.1 eV).

LED's and laser diodes with active (light-emitting) MQW lawyers of, for example, isoelectronically co-doped GaAs:N:Bi:In and GaAs barrier layers, can be fabricated on GaAs substrates with GaInP cladding layers. Similarly, an active region of isoelectronically co-doped GaP:N:Bi can be fabricated on GaP substrates and with GaP barrier layers. In another example, laser diodes with isoelectronically co-doped GaP:N:Bi:In MQW's separated by GaP barriers, and with $Al_xGa_{1-x-y}P$ cladding can be fabricated on Si substrates with multiple, step-graded, layers of $GaP_{1-x-y}N_xBi_y$ between the cladding and Si substrate to reduce lattice mismatch strain.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE INVENTION

Figure 1:
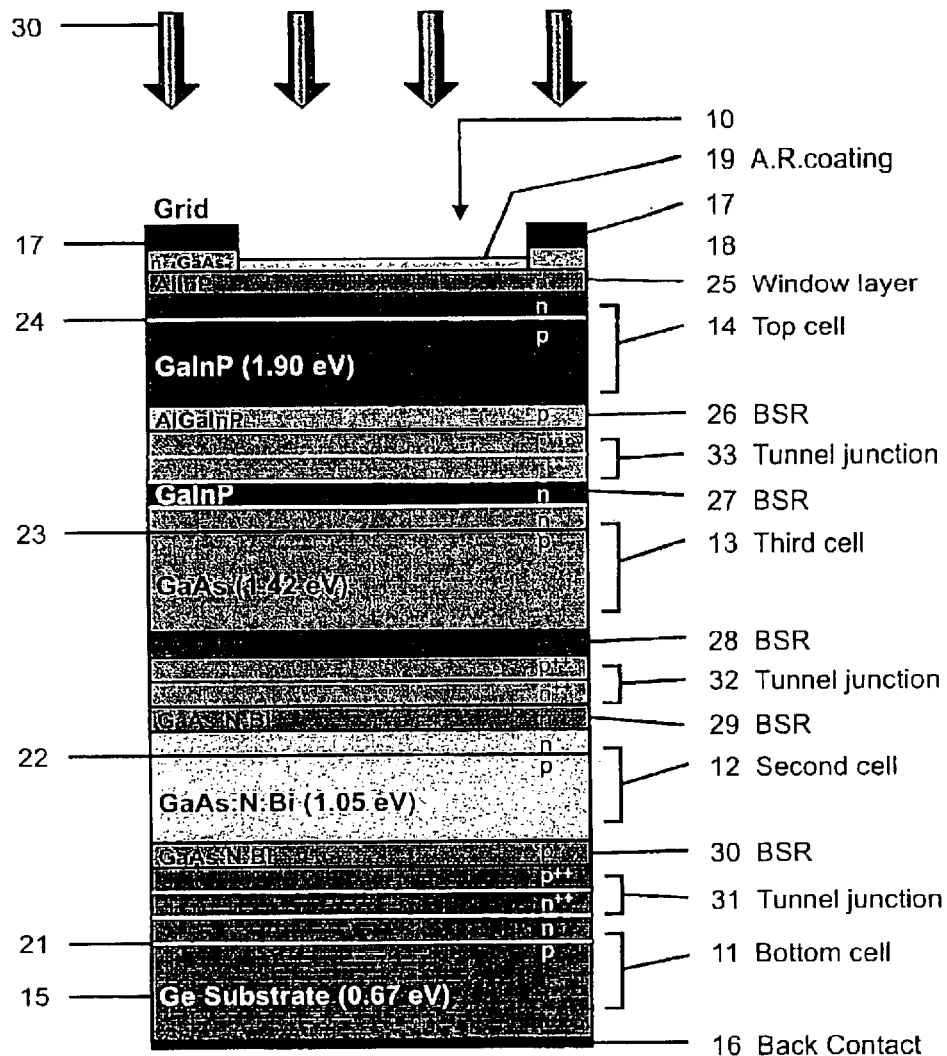
FIG. 1 is a diagrammatic cross-sectional view of monolithic, quadruple junction, solar cell including a cell of isoelectronic co-doped GaAs:N:Bi according to this invention.

An example high efficiency, monolithic, quadruple junction, solar cell 10 constructed according to the principles and by a method of this invention is shown diagrammatically in FIG. 1. An active, light-absorbing cell 12 comprising a dilute alloy of $GaAs_{1-x-y}N_xBi_y$ (sometimes abbreviated as GaAs:N:Bi) with a bandgap of about 1.05 eV is positioned between a Ge cell 11 (bandgap of 0.67 eV) and a GaAs cell 13 (bandgap of 1.42 eV) in the monolithic, quadruple junction, solar cell 10, which also has a InGaP cell 14 (bandgap of 1.90 eV) overlaying the GaAs cell 13 and a Ge substrate 15, which is doped to provide a n-p junction 21 as the bottom Ge cell 11. Of course, the solar cell 10 also has a conventional bottom contact layer 16 and top grid 17 to facilitate electrical connection of the cell 10 into to a circuit (not shown). Other conventional features, such as anti-reflective (A.R.) coating 19, window layer 25 (to passivate the surface), contact layer 18 (to facilitate ohmic contacts), and back surface reflectors (BSR) 26, 27, 28, 29, 30, are also shown, although these components are well-known in the art and are not part of this invention. The BSR layers 26, 27, 28, 29, 30 are designed to be lattice matched to, but with higher bandgaps than, the regions they surround.

When solar radiation 30 irradiates the solar cell 10, the higher energy, shorter wavelength portion of the solar spectrum (e.g., wave-lengths in a range of about 652 nm and below) is absorbed and converted to electric energy substantially in the top (fourth) cell 14 of InGaP, while the lower energy, longer wavelength solar radiation is transmitted into the next (third) cell 13 of GaAs. The next to highest energy range of solar radiation (wavelength of about 873 nm to 652 nm is then absorbed and converted to electric energy substantially in the GaAs third cell 13, which also transmits lower energy solar radiation to the second cell 12 of GaAs-:N:Bi. This GaAs:N:Bi second cell 12 is fabricated according to this invention, as will be explained in more detail below. Solar radiation in the range of about 1180 nm to 873 nm is absorbed and converted to electric energy substantially in this second cell 12, while the remaining unabsorbed, lower energy radiation is transmitted to the first or bottom cell 11 of Ge. The bottom cell 11 absorbs and converts solar radiation in a range of about 1850 nm to 1180 nm to electric energy. Therefore, a monolithic, quadruple junction, solar cell 10 constructed as described above can absorb and convert enough of the solar radiation spectrum to electric energy to approach an overall cell efficiency of 40% AM1.

The charge doping of each cell 11, 12, 13, 14 to fabricate all the p-n junctions can be accomplished according to conventional knowledge, which is usually to add impurity or dopant atoms selected from higher or lower groups on the periodic table of the elements. For example, but not for limitation, the GaAs:N:Bi second cell 12 of this invention can be p-type doped with acceptor atoms from group II (e.g., Zn or Cd) and n-type doped with donor atoms from group VI (e.g., S, Se, or Te) to form the p-n junction 22 of the GaAs:N:Bi second cell 12 as well as the GaAs:N:Bi tunnel junction 32 between the second cell 12 and the third cell 13.

The cell p-n junction 23 in the third cell 13 of GaAs and the GaAs tunnel junction 33 between the third cell 13 and the fourth or top cell 14 can also be fabricated by charged doping with group VI and group II atoms, respectively.

Since Ge is a group IV element, it can be charge doped with, for example, acceptor atoms from group III elements and donors from group V elements to form the p-type and n-type semiconductor materials, respectively, for the n-p junction 21 in the first cell 11 and for the tunnel junction 31 between the bottom cell 11 and the second cell 12. The Ge substrate 15 can also be p-type doped with group III acceptor atoms.

This invention, however, is not limited to the particular solar cell 10 example structure described above, as will become clear to persons skilled in the art. As will be discussed below, the principles of this invention can be used with other alloys and with either n-p or p-n junctions, as well as other solar cell variations.

The GaAs:N:Bi alloy used for the second cell 12 is fabricated by isoelectronic co-doping the GaAs alloy with both nitrogen (N) and bismuth (Bi), preferably simultaneously. While the giant conduction band bowing observed by Weyers et al., in $GaAs_{1-x}N_x$ appeared to demonstrate that the addition of N to GaAs can reduce the bandgap of GaAs significantly, and while the subsequent fabrication of the $Ga_{0.92}In_{0.08}N_{0.03}As_{0.97}$ alloy by Kondow et al., utilized that concept to fabricate a semiconductor material with the desired 1.0 eV bandgap, a significant part of this invention and the motivation for the solutions, processes, and devices described herein is the realization of the following: (i) that, unfortunately, the N in the alloy also creates isoelectronic traps, which have defeated all attempts to utilize such giant bowing of the conduction band; and (ii) that the N in the GaAs does not just induce the bowing of the conduction band of GaAs, but, instead, the N impurities participate directly in the formation of the conduction band via the formation of a deep acceptor N impurity band. A further significant part of this invention includes the discoveries that: (i) Isoelectronic co-doping of GaAs with both N and Bi simultaneously also creates a deep donor; and (ii) The effect of such deep donors on the valence band mirrors the effect of N on the conduction band and virtually eliminates the adverse effects of the N-based isoelectronic traps that have previously defeated use of the otherwise beneficial effects (e.g., bandgap reduction) of N in GaAs semiconductor materials used as photocells. Specifically, such isoelectronic co-doping of GaAs with both N and Bi virtually eliminates the very poor electron mobilities and hopping-like transport characteristics, which are inherent in GaAs that is doped only with N, and it counteracts the increased Madelung energy effects of N in the GaAs crystal lattice that limit solubility of the N in the GaAs material. Such co-doping with N and Bi is isoelectronic, because both N and Bi are in the same group on the periodic table of the elements as the host elements they replace.

Such isoelectronic co-doping of GaAs with N and Bi, according to this invention, not only generates deep acceptor and deep donor impurity bands, which are manifested as apparent giant bowing of the conduction and valance bands that effectively decrease the bandgap in GaAs, but also increases the solubility of both N and Bi in GaAs by such a large extent (almost by a factor of ten) that GaAs:Bi:N alloys which are lattice matched to GaAs with bandgaps near, and even lower than, 1.0 eV can be made with carrier (electrons and holes) mobilities that are enhanced by almost a factor of fifteen over GaAs doped with N alone, i.e., $GaAs_{1-x}N_x$ or GaAs:N. For purposes of this description, "almost by a factor of ten" in the sentence above means more than five times, although more than nine times is achievable. Also, "by almost a factor of fifteen" means more than ten times, although more than thirteen or fourteen times is achievable. Further, "lattice matched" means that the size mismatch between the respective lattice constants can be made less than 0.2%.

Also, while the explanation and illustrations of this invention above and further descriptions of the invention below utilize example isoelectronic co-doping for group III–V semiconductor alloy systems, including GaAs:Bi:N, for ease of explanation and understanding, such isoelectronic co-doping according to this invention is applicable to all semiconductor compounds and alloys. The only significant constraint is that the isoelectronic dopants, for utilization according to this invention, must form isoelectronic traps that behave as deep acceptors or deep donors in the host crystal, as will be explained in more detail below.

As another example of the principles of this invention, ZnSe is a group II–VI semiconductor material. Oxygen (O) is an isoelectronic trap in ZnSe that behaves as a deep acceptor, whereas Te is an isoelectronic trap that behaves as a deep donor. Therefore, co-doping ZnSe with O and Te will enhance the solubilities of each of these co-dopants as well as regularize the behavior of the resulting alloy (i.e., decrease undesirable low carrier mobilities and hopping-like transport characteristics in which the electrons (or holes) hop from one impurity site to another, but do not belong to the delocalized states of the host crystal). Therefore, the electrical properties, such as carrier mobilities and lifetime, and optical properties, such as photoluminescense (PL) efficiency and intensity, lifetime, and reduced tail states in the bandgap, will be improved according to the same physics principles as apply in the isoelectronic co-doping of group III–V semiconductors described above.

Conventional wisdom would imply that isoelectronic substituents, such as N in GaAs, should result in the formation of an alloy, because N and As are isoelectronic, i.e., both are group V elements on the periodic table of the elements, and that N should not create a defect level in GaAs. However, recent experiments by Zhang et al., $Phys. Rev.$ B63, 85205 (2001) have revealed that $GaAs_{1-x}N_x$, is not really an alloy; it is instead a heavily doped semiconductor. N is a group V element that is strongly electronegative—much more so than the group V element As, which results in a N dopant having a short range impurity potential, i.e., behaving as an isoelectronic trap, that captures an electron, thereby leaving a hole bound to the long range coulomb potential in an acceptor-like wavefunction. In other words, such acceptor-like capture of an electron by the N impurities results in a long-range screened coulomb potential, which attracts a hole and results in a neutral exited state, i.e., an exciton bound to an isoelectronic trap. Thus, the N in the GaAs behaves as an isoelectronic deep acceptor analogous to a charged acceptor in charge-doped semiconductors, i.e., semiconductors doped with atoms that substitute in the host from a different group on the periodic table of the elements.

As will be explained in more detail below, to form an isoelectronic trap, the electronic states of the impurity atom must be sufficiently different (in geometric dimensions, pseudopotentials, and electronegativities) from the host atom it replaces in order to produce a local potential capable of binding a hole or an electron. This difference, however, normally makes the substitution of such an atom energetically unfavorable and so limits its solubility, which is the case with N in GaAs. For normal charged doping, lower concentrations of the charged dopant, such as less than 0.01%, do not interfere with carrier transport properties in the host lattice. It is conventional knowledge that higher concentrations of charged particles, such as about 0.1%, begins to merge the impurity levels of the dopant with the bandgap of the host, but also that such higher concentrations of charged dopants interfere with carrier transport properties.

For isoelectronic doping with N in GaAs, a higher concentration of N is beneficial in that it leads to the formation of an impurity band, as will be explained below, that merges with the GaAs conduction band, which is the origin of the apparent giant bowing of the conduction band in $GaAs_{1-x}N_x$ observed by Weyers el al., Zhang et al., $Phys. Rev.$ B63, 85205 (2001) showed that high N doping levels ($>10^{19}$ cm$^{-3}$ or 0.1%) lead to such impurity bands that merge with the GaAs conduction band. However, since N behaves like a deep acceptor such higher concentrations of N in $GaAs_{1-x}N_x$, i.e., about 0.1% or greater, cause carrier transport problems in the $GaAs_{1-x}N_x$ alloy in much the same way that normal charged dopants at concentrations of about 0.1% or higher interfere with carrier transport properties in conventional, charge doped semiconductor materials. It is evident, therefore, that it is not possible to make a decent solar cell with GaAs:N and that attempts to do so will be futile. Further, even though higher concentrations of N would enhance the apparent giant bowing of the conduction band in $GaAs_{1-x}N_x$, the solubility of N in GaAs has been limited to about at 3%. It is noted that content and concentrations of isoelectronic dopants in descriptions of inventions herein are expressed in terms of atomic percent (at. %) of the anion sublattice of a crystal lattice, rather than for the entire crystal lattice, since it is assumed that all but a negligibly small number of the isoelectronic dopants fall on anion sites in the crystal lattice. While it is possible that a very small number of the isoelectronic dopants may fall on cation sites or interstitially, such small number is negligible.

Several efforts to incorporate higher concentrations of N in GaAs:N, such as by growing $GaAs_{1-x}N_x$ out of thermodynamic equilibrium (Miyamoto et al., $J. Cryst. Growth$ 197 (1999) 67), have only further exacerbated problems with electron mobilities. This solubility limit is due to the strong electronegativity and the small size of N atoms, which, when substituted for As atoms in the host lattice, result in an increase of Madelung energy. When more N is forced into the $GaAs_{1-x}N_x$, it causes distortions in the lattice structure. Addition of In to compensate for such lattice structure distortions, as been tried by SR. Kurtz et al., $Appi. Phys. Lett.$ 77(2000) 400, does not solve the problem of poor carrier mobilities.

The isoelectronic co-doping of GaAs with Bi along with N, according to this invention, solves both of the problems described above that are a consequence of isoelectronic doping with N alone. Specifically, when GaAs is isoelectronically co-doped with N and Bi, the strong electronegativity of N, which traps electrons and causes carrier scattering problems as a result of the long range Coulomb field, is screened by the weak electronegativity of Bi, which traps holes. The long range Coulomb fields of the isoelectronic deep acceptor and deep donor are effectively transformed into short range dipole fields, thereby neutralizing the cause of low carrier mobility. At the same time, the large Bi atoms have looser (longer and weaker) bonds to As than the tighter (shorter and stronger) bonds of the small N atoms to the Ga in the lattice, which proves advantageous in simultaneously accommodating these different atoms substitutionally in the host lattice as well as in maintaining lattice matching with the substrate. Therefore, the Madelung energy of the doped crystal lattice remains low, and higher concentrations of N as well as Bi can be incorporated into the host. In other words, the isoelectronic co-doping of GaAs with both N and Bi increases the solubility of both N and Bi in the host GaAs lattice, which, in turn, results in deep bowing in both the conduction band energy and the valence band energy and an ensuing reduction in the bandgap as well as a concomitant increase in the carrier mobilities.

Figure 2:
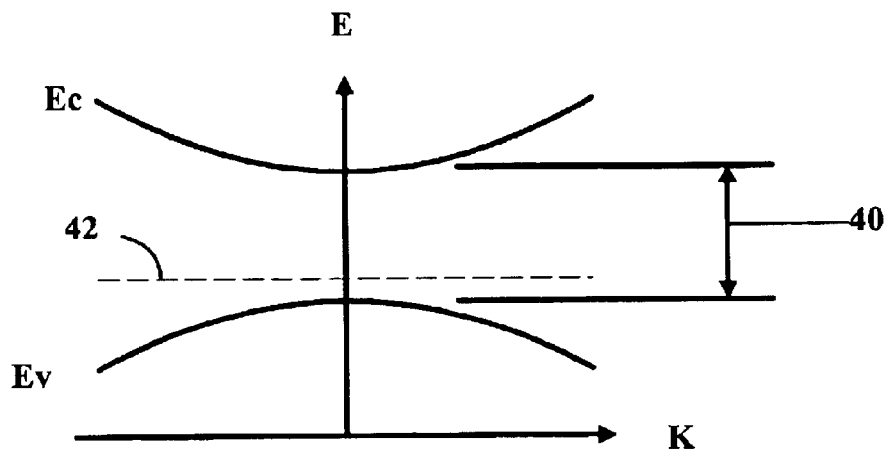
FIG. 2 is a graphical illustration of a prior art direct bandgap with an acceptor dopant energy level.
Figure 3:
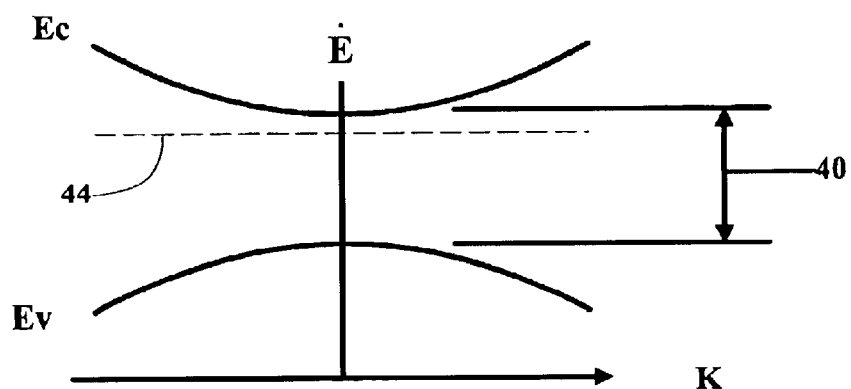
FIG. 3 is a graphical illustration of a prior art direct bandgap with a donor dopant energy level.
Figure 4:
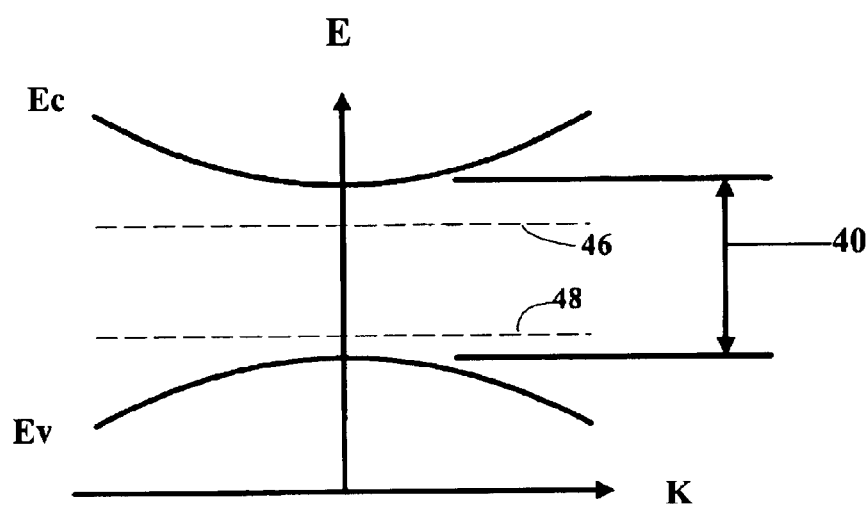
FIG. 4 is a graphical representation of a bandgap of a semiconductor material that is isoelectronic co-doped with deep acceptor and deep donor impurities, including the deep acceptor and deep donor energy levels, according to this invention.

To explain further, reference is made to FIGS. 2, 3, and 4, wherein FIGS. 2 and 3 illustrate dopant energy levels of conventional charged dopant acceptors and donors in a semiconductor material. In FIG. 2, the conduction band energy $E_c$ and valence band energy $E_v$ are illustrated for a semiconductor material with a direct bandgap, i.e., wherein the minimum $E_c$ and the maximum $E_v$ both occur where the momentum vector k=0. In other words, an electron crossing the bandgap 40 has only to change its energy, but not its momentum, as opposed to an indirect bandgap material in which such an electron crossing the bandgap would also have to change its momentum. A conventional p-type charged dopant is an acceptor type atom, which is usually of one group to the left of a host element on the periodic table of the elements, i.e., one fewer electron in the outer energy shell. Such a conventional, charged acceptor dopant band 42 is illustrated in FIG. 2, which shows that the conventional, charged acceptor dopant energy level is closer to the valence energy band $E_v$ than to the conduction energy band $E_c$. A conventional, charged donor dopant band 44, as shown in FIG. 3, is closer to the conduction energy band $E_c$ than to the valence energy band $E_v$.

In contrast, as illustrated in FIG. 4, the isoelectronic dopant level 46 created by the N pairs in GaAs:N:Bi behave like a "deep acceptor", i.e., an acceptor with a dopant level 46 that is farther away from the valence energy band $E_v$ and closer to the conduction energy band $E_c$. At the same time, the isoelectronic dopant level 48 created by the Bi in GaAs:N:Bi is a "deep donor", i.e., a donor with a dopant level 48 that is farther away from the conduction energy band $E_c$ and closer to the valence energy band $E_v$.

In the following explanation of deep donors and deep acceptors, it would be repetitious and unnecessarily cumbersome to describe the physical principles, behavior, and features of deep acceptors, which are opposite in polarity, thus have equal, but opposite physical effects, as will be understood by persons skilled in the art. Therefore, for convenience and expedience, the following explanation will be made principally regarding deep donors, and, where appropriate, terms relating to deep donors will be followed by corresponding, but opposite, terms related to deep acceptors in parentheses, instead of repeating entire sentences for the corresponding, but opposite, principles, behaviors, and features relating to deep acceptors.

For very dilute doping concentrations, the distances between neighboring donor (acceptor) atoms is large, such that there is no spatial overlap between the neighboring donor (acceptor) wavefunctions, and the impurity energy level for all donors (acceptors) is the same, as shown in FIGS. 2 and 3. However, as the concentration of dopant atoms in the host semiconductor is increased, the distance between neighboring donors (acceptors) decreases such that there is spatial overlap between neighboring donors (acceptors) wavefunctions. The Pauli exclusion principle forbids any two donors (acceptors) from having the same energy level, so the position of the energy level of each donor (acceptor) is slightly displaced with respect to the energy level of every other donor (acceptor). This set of closely spaced energy levels due to donors (acceptors) is referred to as a donor (acceptor) band or, more generally, impurity band. Thus, high doping concentrations inevitably result in the formation of impurity bands, and, when these impurity bands become broad enough, they merge with the conduction (valence) band edges, resulting in a lowering of the conduction (valence) band minima (maxima). This lowering of the conduction (valence) band minima (maxima) causes the lowering of the bandgap, i.e., bandgap bowing, observed on heavy doping.

In contrast to an impurity band, there is a strong wavefunction overlap between the neighboring atoms belonging to the host semiconductor lattice, so electrons (holes) can move more easily in the lattice, i.e., high mobilities. In an impurity band, the spatial overlap between neighboring impurity wavefunctions is much less than the overlap of host atom wavefunctions, so electrons (holes) cannot move about the lattice so easily. The mobility is low, and there is so-called hopping conduction, where electrons (holes) hop from one impurity site to the nearest adjacent impurity site. By enhancing the solubility of impurities in the host, one decreases the distance between impurities, increases impurity wavefunction overlap, decreases the effective mass of electrons (holes), and greatly increases the mobilities of electrons (holes).

On isoelectronically co-doping GaAs with N and Bi, the bandgap reduction due to the conduction band $E_c$ bowing generated by the N doping is reinforced or enhanced by the addition of the Bi, which has an analogous effect on the valence band. At the same time, GaAs:N:Bi can be lattice matched to GaAs, which makes it compatible and useable as an active cell component 12 adjacent a GaAs cell component 13 in a multi-junction solar cell, such as the monolithic, quadruple junction solar cell 10 illustrated in FIG. 1. Further, since the solubility of both N and Bi in GaAs is enhanced by almost a factor of 10 by isoelectronic co-doping of the GaAs with N and Bi over the solubility of either N or Bi alone in GaAs, and since the carrier mobilities are enhanced by almost a factor of 15, GaAs:N:Bi with bandgaps lower than 1.0 eV—actually, anywhere in a range of less than 1.42 eV down to 0.8 eV—lattice matched to GaAs can be fabricated according to this invention by selecting desired concentrations and proportions of N and Bi to obtain the desired specific bandgap and lattice matching, as is well within the capabilities of persons skilled in the art once they understand the principles of this invention.

For purposes of this invention, therefore, an isoelectronic deep acceptor element or dopant can be described as an isoelectronic dopant that is more electronegative than the host lattice element for which it substitutes and has dopant energy levels which are closer to the conduction energy band $E_c$ of the host semiconductor alloy than to the valence energy band $E_v$ of the host semiconductor alloy and that behave as electron traps. Also, an isoelectronic deep donor element or dopant, for purposes of this invention, can be described as an isoelectronic dopant that is less electronegative than the host lattice element for which it substitutes and has dopant energy levels which are closer to the valence energy band $E_v$ of the host semiconductor alloy than to the conduction energy band $E_c$ of the host semiconductor alloy and that behave as hole traps.

To explain further, when a few isoelectronic dopant atoms are introduced into a host crystal lattice, the presence of a single, isolated impurity generates either (i) an electronic state whose energy level is in the otherwise forbidden region for electronic state energies, i.e., the bandgap, or (ii) an electronic state whose energy level is located either above the conduction band $E_c$ minimum or below the valence band $E_v$ maximum. An impurity electronic state, whose energy is located in the forbidden bandgap is called a "bound state", because carriers get localized, i.e., bound, around such electron states. An impurity electronic state whose energy level is located in either the conduction band or the valence band is called a "resonant impurity state".

However, when a large number of the isoelectronic dopant atoms are introduced into the host crystal lattice, i.e., more than about 10 cm$^{-3}$, the interaction between neighboring dopant atoms, i.e., pair interaction, triplet interaction, etc., in turn generates impurity bands. For heavy doping, such as is used for N (or Bi) in GaAs or in Gap, it is these various impurity levels generated by the impurity interactions that generate "bound states" whose energy levels merge with the conduction band (or valence band in the case of Bi), and such merger gets manifested as the bandgap bowing.

Because of the difference in valency between the dopant atom and the host lattice atom that is replaced by the dopant atom, a normal, i.e., non-isoelectronic, donor atom donates an electron to the conduction band of the host crystal lattice. Upon donating the electron, the donor atom is ionized and has a net positive charge. The coulomb field of such normal donor ion thus varies with distance as $r^{-2}$, i.e., is inversely proportional to distance r squared. The coulomb potential varies as $r^{-1}$. Such normal, non-isoelectronic donors are called charged donors. An analogous situation holds for non-isoelectronic acceptors and holes, which are called charged acceptors.

In contrast, for isoelectronic traps generated by isoelectronic dopants or impurities, such as those generated by N (or Bi) impurities in GaAs or in GaP, it is the difference in electronegativity, size, and pseudopotential between the isoelectronic impurity and the host lattice atom it replaces that generates the trap state. Such trap states are characterized by a potential that varies with distance much faster than $r^{-1}$. The potential well created by the isoelectronic trap is, therefore, much steeper than that created by a charged donor (acceptor) and, because of this much steeper potential well, an electron (hole) trapped around the isoelectronic dopant or impurity atom, e.g., N (Bi), is localized much more tightly around the isoelectronic dopant or impurity atom than is the case for a charged donor (acceptor). In fact, the coulomb attraction between a charged, i.e., ionized, donor (acceptor) and an electron (hole) is small enough to be negligible, which explains why the electrons (holes) in crystal lattices doped with charged donors (acceptors) can move about freely in the conduction (valence) band. In contrast, an electron (hole) bound by an isoelectronic trap is localized in real space around the isoelectronic trap and cannot move freely in the conduction (valence) band.

Such localization of electrons (holes) bound by an isoelectronic trap smears out the eigenstates of the isoelectronic impurity trap in k-space, i.e., momentum vector characteristics, thereby causing the impurity electronic states to be delocalized in k-space. This delocalization of the impurity electronic states in k-space has beneficial effects that are utilized in this invention. For example, when an indirect bandgap semiconductor material, such as GaP, is doped with an isoelectronic impurity, such as N, this delocalization of the impurity electronic states in k-space increases the probability of radiative recombination in such indirect bandgap semiconductor materials, thereby causing them to behave more like direct bandgap materials. The benefits of this feature combined with the isoelectronic co-doping of GaP according to this invention for electronic devices will be described in more detail below.

The impurity levels introduced by normally used charged acceptors, such as impurity level 42 illustrated in FIG. 2, are located typically a few meV, e.g., about 20 meV, above the valence band edge $E_v$. Likewise, impurity levels introduced by normally used charged donors, such as impurity level 44 illustrated in FIG. 3, are typically a few meV below the conductor band edge $E_c$. If the depth of these levels introduced by impurities were to be greater than the room temperature Boltzmann energy kT=26 meV, then most of the dopants would not be ionized at room temperature, thus would not behave as acceptors or donors. Impurity levels induced by charged acceptors or donors that are much deeper than 26 meV are referred to as deep levels.

In the case of isoelectronic dopants to be utilized for co-doping according to this invention, as illustrated in FIG. 4, an impurity level 46 induced by an electron trap, such as N, is near the conduction band $E_c$ rather than being near the valence band $E_v$. Therefore, an isoelectronic dopant such as N, which forms an electron trap and induces an impurity level 46 that is closer to the conduction band $E_c$ than to the valence band $E_v$ is referred to as an isoelectronic deep acceptor. On the other hand, an impurity level 48 induced by a hole trap, such as Bi, is near the valence band $E_v$ rather than being near the conduction band $E_c$. Therefore, an isoelectronic dopant, such as Bi, which forms a hole trap and induces an impurity level 48 that is closer to the valence band $E_v$ than to the conduction band $E_c$ is referred to as in isoelectronic deep donor.

It is this characteristic of isoelectronic electron trap-induced impurity levels generating states with localized electrons just below the conduction band $E_c$ edge, and of isoelectronic hole trap induced impurity levels generating states with localized holes just above the valence band $E_v$ edge that causes the massive conduction band bowing in semiconductor materials. This desirable feature of isoelectronic dopants, for example, N and Bi, is utilized in the embodiments and implementations of this invention. Further, the otherwise inherent undesirable features of isoelectronic doping, including poor solubility, poor mobility due to formation of impurity bonds, and poor carrier lifetimes are alleviated by using the technique of co-doping with isoelectronic deep acceptors and deep donors according to this invention.

Referring again to FIG. 1, Ge can be used for the bottom or first cell 11 in the monolithic, quadruple junction solar cell 10 to provide the desired 0.67 eV bandgap for the solar cell 10, because the isoelectronically co-doped GaAs:N:Bi alloy of this invention can be grown nearly lattice matched with Ge, i.e., within about 0.2% misfit strain, to provide sufficient durability and carrier mobility for an efficient solar cell device. While Ge has an indirect bandgap, it is still suitable for the bottom cell 11 when used as a substrate 15 that also incorporates the Ge bottom cell 11, because the substrate 15 provides sufficient thickness for the Ge cell 11 to absorb substantially all the light in the 1850 nm to 1180 nm wavelength range.

Any known procedure for co-doping, which is well-known in the art, can be used to accomplish the isoelectronic co-doping of alloys according to this invention, such as sequential bombardment of GaAs with N and Bi to implant overlapping N and Bi dopant profiles in the GaAs or by using OMVPE (organo-metallic vapor phase epitaxy) growth techniques. A suitable organic source for Bi—trimethylbismuth—is available commercially, for example, from Robin and Haas of North Andover, Mass. Nitrogen can be obtained from dimethyihydrazine, as is also well-known to persons skilled in the art, which can be obtained from the same company. The co-doping can also be achieved using molecular beam epitaxy (MBE) growth, vapor phase epitaxy (VPE) growth, or Liquid Phase Epitaxy growth (LPE). Co-doping using ion-implantation techniques are described, for example in S.P. Witrow et al., "Ion Beam Annealing of Si Co-Implanted with Ga and As", *Mat. Res. Soc. Sym Proc.*, Vol. 57, pp. 143–148, 1990, which is a current definitive, state-of-the-art reference and a authority on co-doping, as well as in several other articles published since 1990. Also, as mentioned above, this invention is not limited to isoelectronic co-doping of GaAs with N and Bi. For example, but not for limitation, InP, GaP, InGaAs, and ZnSe can also be isoelectronic co-doped with "deep" acceptors and "deep" donors with similar benefits as those described above for GaAs alloys.

Isoelectronic co-doping of semiconductor alloys according to this invention also has other applications. For example, it can be used to create much more efficient and much more economical tandem solar cells, even utilizing silicon, which has an indirect bandgap, but which is abundant and cheap, as a substrate. Theoretical optimum 1 Sun AM1 efficiencies for a two-cell tandem solar cell would be obtained with a 1.8 eV/1.0 eV combination and for a three-cell tandem solar cell would be obtained with a 2.2 eV/1.6 eV/1.0 eV combination. Prior to this invention, the best efficiency tandem (two or three junctions) solar cells available utilize GaInP/GaAs or GaInP/GaAs/Ge as the lattice matched semiconductor materials that provide active absorbing media for the tandem cells with bandgap combinations of 1.85 eV/1.42 eV and 1.85 eV/1.42 eV/0.67 eV, respectively. A two-cell tandem solar cell 50 according to this invention, illustrated in FIG. 5, has a bandgap combination of 1.75 eV/1.1 eV, which is much closer to the theoretical optimum for two cells. A three-cell tandem solar cell 70 according to this invention, illustrated in FIG. 6, has a bandgap combination of 2.05 eV/1.55 eV/1.1 eV, which is much closer to the theoretical optimum for three cells. Both of these tandem cells 50, 70 utilize Si for the substrate and bottom cell.

Figure 5:
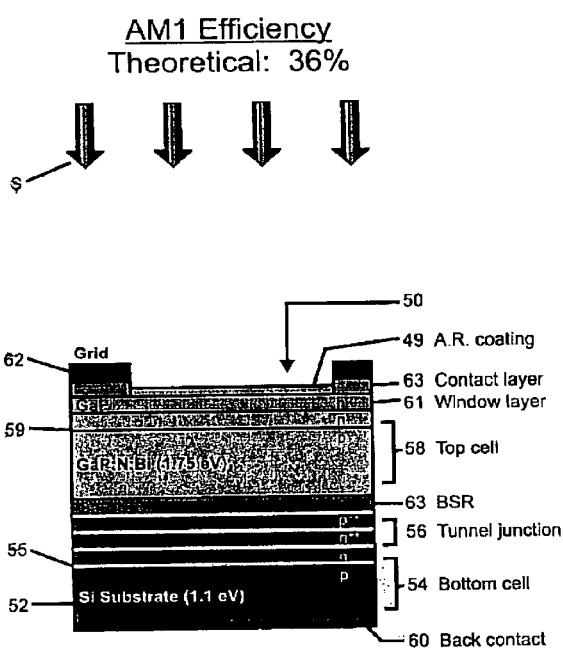
FIG. 5 is a diagrammatic cross-sectional view of a two-junction tandem solar cell using an isoelectronic co-doped GaP:N:Bi cell on a Si substrate and cell according to this invention.

Referring to FIG. 5, a two-junction tandem solar cell 50 according to this invention has a Si substrate 52, which is doped to provide a n-p junction 55, as is well-known to persons skilled in the art, to function as the bottom cell 54 with a bandgap of 1.1 eV. It also has a top cell 58 of isoelectronic co-doped GaP:N:Bi alloy according to this invention, which has a bandgap of 1.75 eV. The GaP:N:Bi alloy is charge doped with an acceptor, such as Zn or Cd, and with a donor, such as S or Se, to form a n-p junction 59. A tunnel junction 56 of $n^{++}$- and $p^{++}$-doped Si is also provided between the bottom cell 54 and the top cell 58, as is within the capabilities of persons skilled in the art. Of course, the junctions 55, 59 could be inverted to p-n junctions, and the $p^{++}$-$n^{++}$ tunnel junction 56 could be inverted to a $n^{++}$-$p^{++}$ tunnel junction, as would be within the capabilities of persons skilled in the art. Of course, a bottom contact 60 and grid contacts 62 are provided to connect the solar cell 50 into an electric circuit (not shown); as is also within the capabilities of persons skilled in the art. The back surface reflector (BSR) 63, anti-reflection coating (ARC) 49, window layer 61, and contact layer 63 are conventional and well-known to persons skilled in the art and not part of this invention.

It is common knowledge that Si has a 1.1 eV bandgap. However, prior to this invention, there were no direct bandgap semiconductor materials that could both: (i) be lattice matched to Si; and (ii) provide a bandgap close to the optimum 1.75 eV for the second cell of a two-cell combination tandem solar cell or provide bandgaps close to the optimum 1.55 eV and 2.05 eV bandgaps for the second cell and third (top) cell, respectively, of a three-cell combination tandem solar cell. For example, although it is known that GaP is closely lattice matched to Si (0.37% compressive misfit strain at room temperature) and can be alloyed, for example, with In to bring the bandgap to somewhere in the vicinity of the theoretical optimums for second and third cells in tandem with Si, the resulting GaInP alloy would then be highly lattice mismatched to the Si substrate.

To further exacerbate problems in using GaP on Si, GaP has a very slightly larger lattice than Si, and it has a thermal expansion coefficient that is about double that of Si. The best technology for growth of GaP on Si utilizes a two-step process in which a thin GaP layer is grown at low temperature to achieve 2-dimensional growth of polar GaP on non polar Si substrates that are miscut to eliminate anti-phase boundaries associated with polar or non-polar growth, followed by high-temperature growth of GaP. Therefore, at the high-growth temperatures (>700° C.) required for good quality MOCVD (metal-organic chemical vapor deposition) grown epilayers of GaP on Si, the misfit strain changes from 0.37% compressive at room temperature to about 0.65% compressive at the high growth temperature. This value of misfit strain at the growth temperature, which is 0.28% compressive greater than the room temperature misfit strain of 0.37% compressive, results in a typically 1 $\mu$m thick epilayer of GaP on silicon being mostly relaxed at the growth temperature. However, subsequent cool down to room temperature results in crystal cracking problems.

Figure 6:
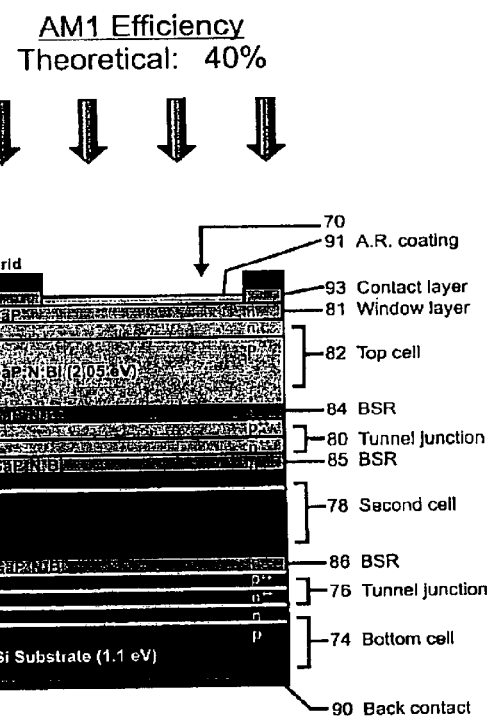
FIG. 6 is a diagrammatic cross-sectional view of a three-junction tandem solar cell using two isoelectronic co-doped GaP:N:Bi cells on a Si substrate and cell according to this invention.

Now, according to this invention, GaP semiconductor material can be used as a second cell in combination with a Si first or bottom cell, as illustrated in FIGS. 5 and 6, by isoelectronically co-doping GaP or alloys of GaP with isoelectronic deep acceptor and deep donor levels, for example, but not for limitation, N and Bi, which form impurity bands at high doping levels, to lower the bandgap of GaP from 2.26 eV to values close to optimum for second and third cells in tandem solar cells 50, 70 built on silicon substrates and/or bottom cells. Since GaP is an indirect gap semiconductor, FIGS. 2, 3, and 4, which are drawn to illustrate a direct gap semiconductor, would have to be modified with the minimum of the conduction band $E_c$ displaced laterally, i.e., in the k direction, in relation to the maximum of the valence band $E_v$, but all of the rest of the explanation above relating to deep donors and deep acceptors isoelectronic co-doping continue to apply. With such isoelectronic co-doping according to this invention, solubility of the isoelectronic co-dopants in GaP at levels of 6% or more can be attained with resulting bandgaps as low as about 1.55 eV. Such isoelectronic co-doping, in addition to alleviating the low solubility problems of one isoelectronic species alone, also minimizes band tailing, mid-gap trap states, low minority carrier lifetime, and low carrier mobility problems encountered with one isoelectronic species alone, as described above.

Wavefunction delocalization in momentum space circumvents the indirect bandgap problem of GaP so that strong light absorption is obtainable with thin film layers of GaP:N:Bi alloys according to this invention. Essentially, as was known prior to this invention, N in GaP makes GaP behave like a direct bandgap semiconductor material, as demonstrated by light emission from GaP:N LEDs (light emitting diodes). The isoelectronic co-doping of GaP with an isoelectronic deep donor dopant, such as Bi, and with an isoelectronic deep acceptor, such as N, according to this invention, further enhances such direct bandgap behavior because of the higher concentrations of N achievable by co-doping as well as the enhanced electronic transitions between the respective N deep acceptor and Bi deep donor impurity bands, which induces strong light absorption ($\alpha=10^4$ to $10^5$) in isoelectronically co-doped GaP:N:Bi alloys of this invention.

More specifically, in the GaP crystal lattice, the wavefunctions of electrons in the conduction band are delocalized, i.e., an electron can be found with equal probability in any region of the lattice. Even though the exact position of such an electron in the lattice is uncertain, it does have a well-defined momentum, i.e., it is localized in momentum space, also referred to as k-space. As a general theorem, localization in real space implies delocalization in momentum space, i.e., k-space, and vice versa. Every wavefunction (Bloch state) describing conduction band minimum electrons has a unique wave vector (momentum vector) k, which, since GaP is an indirect semiconductor, is never equal to zero. In doping with N, an impurity band is formed, and the energy position of such impurity band is just below the conduction band minimum. As the N doping concentration is increased, this impurity band broadens and merges with the conduction band and, consequently, constitutes the new conduction band minimum. However, in contrast to the delocalized wavefunctions of the conduction band prior to N doping, the wavefunctions in the impurity band are localized to some degree around the N impurities, which trap electrons. In other words, an electron will not be found with equal probability in any region of the lattice, but will instead have a higher probability of being found around the N impurities than in other regions of the lattice. Therefore, according to the general theorem stated above, these impurity band wavefunctions must, to some extent, be delocalized in momentum (k) space, which is to say that the impurity band wavefunctions do not have a well-defined momentum. In other words, that momentum is not a good quantum number for the electron in the impurity band. Consequently, there is no longer the momentum constraint (as there is in GaP not doped with N) forbidding the electron from making a transition to the valence band, thus leading to strong light absorption in the N doped GaP.

Therefore, the ability to increase N doping concentration in GaP by isoelectronically co-doping GaP with N and Bi according to this invention does enhance the ability of GaP to absorb light. More important, however, as explained above in relation to other alloys that are isoelectronically co-doped according to this invention, the properties of the isoelectronically co-doped alloy are regularized. For example, the low carrier mobilities and hopping-like transport characteristics of N doped GaP are minimized or eliminated in isoelectronically co-doped GaP:N:Bi according to this invention.

Further, isoelectronic co-doping of GaP with isoelectronic deep acceptors and deep donors, for example, but not for limitation, N and Bi, according to this invention can alleviate the crystal cracking problems of GaP grown at high temperatures on Si due to the higher coefficient of thermal expansion of GaP as compared to Si. When N is put into GaP, the lattice gets smaller, because N atoms are small. In fact, if the concentration of N in GaP:N is 4 at. % or more, the lattice will be too small to match the Si lattice. However, addition of large Bi atoms along with N in the isoelectronic co-doping of this invention can compensate for the small N atoms to maintain a lattice size that is a better match with Si. In fact, the amount of Bi in relation to the N can be proportioned to provide a GaP:N:Bi lattice, which, when cooled, is matched in size to Si at room temperature. For example, by isoelectronically co-doping GaP with about 6 at. % N (5 at. % to 7 at. %) and about 3.4 at. % Bi (2.4 at. % to 4.4 at. %) according to this invention, the room temperature misfit strain of GaP:N:B can be tailored to be about 0.14% tensile, as opposed to the room temperature misfit strain of about 0.37% compressive between GaP and Si. Such misfit strain of 0.14% tensile will subtract from the 0.28% compressive mismatch strain increment caused by differential thermal expansion of the GaP:N:Bi and the Si during the high-temperature growth phase. In other words, during high-temperature growth of the GaP:N:Bi on Si, the high temperature misfit strain of 0.65% compressive is reduced to a mere 0.14% compressive strain. Consequently, coherent epitaxial growth of GaP:N:Bi on Si at high temperatures, i.e., at least about 700° C., can be achieved, and crystal cracking problems upon cool down to room temperature can be eliminated. The term "about" when used in relation to high temperature in describing this invention means plus or minus 50° C. Other concentrations of N in the GaP:N:Bi alloy grown on Si, according to this invention, can be proportionally matched with Bi concentrations as described above so that the misfit strains and crystal cracking problems of GaP grown at high temperatures on Si are minimized. In general, by tuning the co-doping levels of N and B in GaP:N:Bi, bandgaps of about 1.55 eV, 1.75 eV, and 2.0 eV can be fabricated, and a pre-set amount of compensating lattice mismatch strain can be tailored, as described above.

The example two-junction tandem solar cell 50 illustrated in FIG. 5, utilized isoelectronic co-doped GaP:N:Bi with a bandgap of about 1.75 eV (1.65 eV to 1.85 eV) according to this invention to fabricate the second or top cell 58 on the Si bottom cell 54 (fabricated on a Si substrate 52), which has a bandgap of about 1.1 eV. The top cell 58 absorbs light energy in a wavelength range of about 708 nm and below and converts it to electricity, while the bottom cell 54 absorbs light energy in a wavelength range of about 1127 nm to 708 nm and converts it to electricity.

The example three-cell tandem solar cell 70 illustrated in FIG. 6 has a Si first or bottom cell 74 fabricated on a Si substrate 72 with n-p or p-n doped active junction 75 and a bandgap of about 1.1 eV, similar to the bottom cell 54 in solar cell 50 described above. Also, a $p^{++}$-$n^{+30}$ or $n^{++}$-$p^{++}$ Si tunnel junction 76 similar to the tunnel junction 56 in solar cell 50 is provided over the bottom cell 74. An isoelectronic co-doped GaP:N:Bi semiconductor alloy according to this invention with a bandgap of about 1.55 eV (1.45 eV to 1.65 eV) is utilized for the second cell 78. In general, the higher the concentration of the isoelectronic co-dopants, the lower the effective bandgap of the resulting isoelectronically co-doped semiconductor alloy. Therefore, once persons skilled in the art understand this invention, they will be able to tailor any of the semiconductor alloys discussed herein to the desired bandgaps. The GaP:N:Bi second cell 78 is charge doped to provide a n-p or a p-n junction 79, as described above for the second cell 58 of solar cell 50, a more heavily doped tunnel junction 80 is provided over the second cell 78 and a BSR layer 85, as will be understood by persons skilled in the art. A third or top cell 82 of isoelectronic co-doped GaP:N:Bi ahoy with a bandgap of about 2.05 eV (1.95 eV to 2.15 eV) according to this invention is provided over the second cell 78, tunnel junction 80, and BSR layer 84. The GaP:N:Bi top cell is charged doped to form a n-p or p-n junction 83 similar to the doping for the junction 79 in the second cell 78, as will be understood by persons skilled in the art. A bottom contact 90 and top grid contacts 92 are also provided, as will be understood by persons skilled in the art.

The top cell 82 of the solar cell 70 absorbs light energy in a wavelength range of about 605 nm and below and converts it to electricity, while the second cell 78 and bottom cell 75 absorb light energy in respective wavelength ranges of 605 nm to 800 nm and 800 nm to 1127 nm and convert it to electricity.

The two-cell solar cell 50 design based on 1.75 eV/1.1 eV and the three-cell solar cell 70 design based on 2.0 eV/1.55 eV/1.1 eV combinations using GaP do-doped with isoelectronic deep acceptor and deep donor species according to this invention are simple, yet they elegantly incorporate all the key principle requirements for ideal tandem solar cell design—inexpensive substrates and optimal match to the solar spectrum. The respective 1.75 eV/1.1 eV and 2.0 eV/1.55 eV/1.1 eV combinations of solar cells 50, 70 are close to the optimal respective 1.8 eV/1.0 eV and 2.2 eV/1.6 eV/1.0 eV design values for such devices. Si, as contrasted with GaAs, can be used as the substrate 52, 72 and for the bottom cells 54, 74, which is a significant advantage, because Si substrates are much less expensive than GaAs. Also, the technology for growth of GaP on Si, such as use of 4° tilted substrates to eliminate APB's (anti-phase boundaries), two-step growth using low-temperature grown GaP layer to achieve 2-D growth of polar GaP on non-polar Si followed by high-temperature growth of GaP, is already developed and can be used for growth of the isoelectronic co-doped GaP alloys of this invention. Photoelectronic conversion efficiencies of these solar cell designs according to this invention are superior to previously known two-cell and three-cell tandem designs, and they are much less expensive.

Since, in principle, a solar cell is just an LED (light emitting diode) operating in reverse, GaAs co-doped with isoelectronic deep acceptors and deep donors, such as N and Bi, according to this invention, can also be used to provide simpler and less expensive LEDs and laser diodes than the current state of the art InGaAsP devices for signal generation in wavelengths that are most efficient, therefore preferred, for fiber optic transmission. A laser diode is basically an LED, which includes quantum and optical confinement structures to produce a very narrow, intense beam of coherent light. Therefore, unless indicated otherwise, references herein to LEDs are meant to also include laser diodes. Fiber optic communications of voice, video, and digital data is based on silica optical fibers, which, for single mode, long haul transmission applications, have the highest bandwidth and lowest attenuation in a wavelength range or "window" centered around 1.55 $\mu$m. This low loss wavelength transmission window of silica optical fiber also matches the maximum in the gain bandwidth for erbium-doped fiber amplifiers. As mentioned above, prior to this invention, the optimal signal generation sources for this 1.55 $\mu$m wavelength were InGaAsP quaternary alloy based semiconductor laser diodes grown on InP substrates.

Photoelectric production of 1.55 $\mu$m light requires a semiconductor bandgap of about 0.8 eV. GaAs (1.42 eV) can be isoelectronically co-doped with isoelectronic deep acceptors and deep donors according to this invention to lower the bandgap of GaAs to create semiconductor materials with effective bandgaps corresponding to about 0.8 eV (0.7 eV to 0.9 eV). For example, GaAs (1.42 eV) can be isoelectronically co-doped either with N and Bi to create GaAs:N:Bi with an effective bandgap of about 0.8 eV. Therefore, this isoelectronic co-doped material can be used as an active layer for LED, including laser diode, structures to generate light with a wavelength of about 1.55 $\mu$m. Similarly, photoelectric production of 1.3 $\mu$m light requires a semiconductor bandgap of about 0.95 eV, which can be achieved by isoelectronically co-doping GaAs with deep acceptors and deep donors according to this invention.

Figure 7:
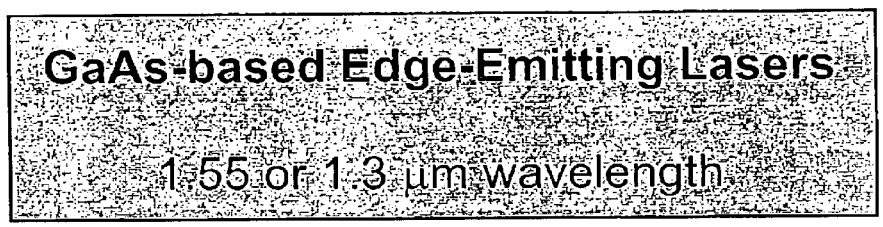
FIG. 7 is an isometric diagrammatic view of a GaAs based edge-emitting laser application of this invention that produces light in preferred fiber optic communication signal wavelengths.
Figure 7:
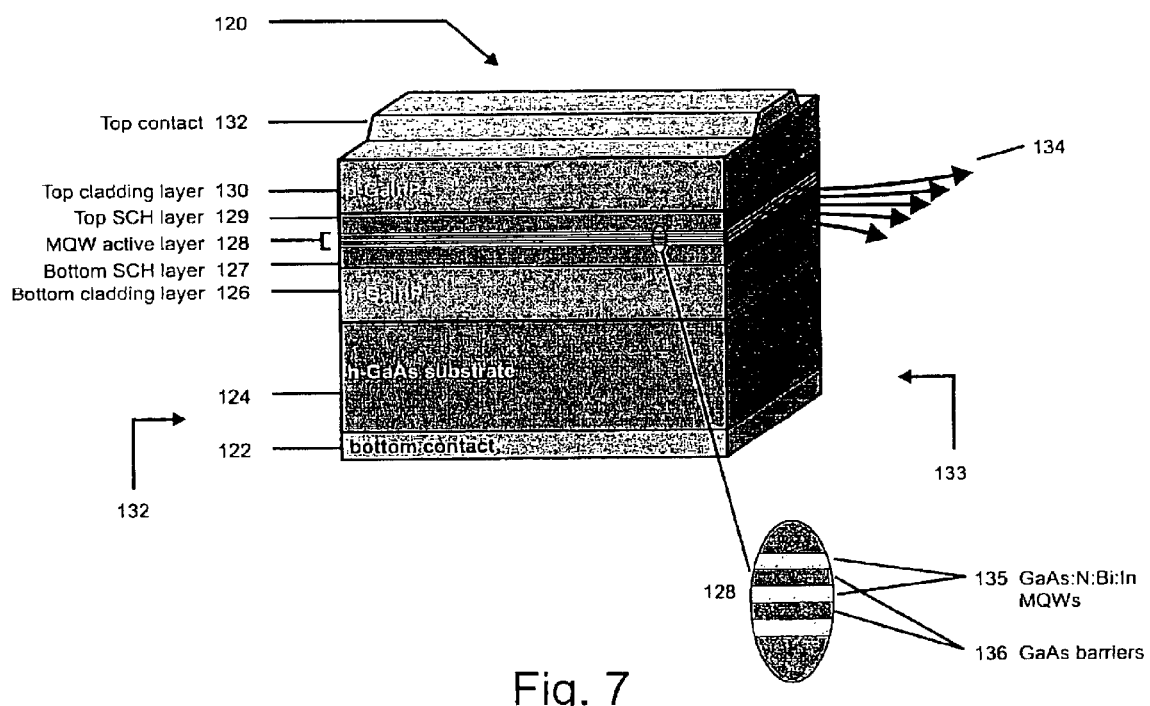

As shown in FIG. 7, isoelectronic co-doping, according to this invention, can also be used to fabricate semiconductor diode edge-emitting lasers 120 on GaAs substrates, which operate in the 1.55 or 1.3 $\mu$m wavelength regions for fiber-optic network communications. An n-type GaInP$_2$ cladding layer (low refractive index optical confining layer) 126 is grown lattice matched over an n-type GaAs substrate 124 followed by a bottom GaAs separate confinement heterostructure (SCH) layer 127. The active region 128 (see inset in FIG. 7) comprises a set of multiple quantum wells (MQW) 135 of isoelectronically co-doped GaAs:N:Bi:In, where each well is surrounded by GaAs barriers 136. The amount of isoelectronic co-doping of the MQW's 135 and the MQW 135 well widths are chosen to yield ground state transition energies near 0.8~9.3 eV (1.55 or 1.3 $\mu$m). The In is added to provide an additional parameter for lattice matching so that the N to Bi ratio can be adjusted independently for optimally regularizing the behavior of the alloy. The GaAs top SCH layer 129 is then grown followed by the top p-type GaInP$_2$ cladding layer 130 and a top contact stripe 132. The overall structure 120 is that of a p-i-n diode. When a voltage is applied to the top contact 132 and bottom contact 122 to forward bias the p-i-n diode, the barriers 136 in the MQW's 135 provide quantum confinement for the electrons and holes injected from the n (126) and p (130) regions, respectively, under the forward bias into the active region 128. The cladding layers 126 and 130 provide optical confinement for the radiation emitted as a result of the recombination of the injected electrons and holes in the MQW's 135. The thickness of the top and bottom separate confinement heterostructure (SCH) layers 127 and 129 is of the order of an optical wavelength, thereby confining in the transverse direction the optical Fabry-Perot cavity bounded longitudinally by the front and rear mirrors formed by the cleaved faces 133 and 131 respectively. The mirrors may be coated to increase or decrease their reflectivity as necessary or desired to produce and emit a laser light beam 134, as is understood by persons skilled in the art. Carrier flow in the vertical direction follows the contour defined by the lateral stripe shape of the top contact 132. Thus, the lasing area is limited in the lateral direction to the stripe region defined by the top contact 132 because of gain guiding. Details such as contact layers for low resistance contacts and buffer layers are not shown. The edge-emitting laser in FIG. 7 illustrates the most basic edge-emitting laser configuration. Other means of defining the stripe geometry for limiting the lateral width of the lasing area can be used such as those employed for the ridge-waveguide laser configuration or by using index guiding as for the buried heterostructure (BH) laser configuration, or by forming mesa or inverse mesa geometry structures. Many techniques, such as the use of reverse biased diodes as lateral current blocking layers, or oxide or polymide insulating layers or deeply etched recesses for lateral isolation and lowering of parasitic capacitances, can be used as is within the capabilities of persons skilled in the art. Also, as is well within the capabilities of persons skilled in the art, by inserting a grating profile layer at the bottom or top interface of the cladding layers 130 or 126, a DFB (distributed feedback) laser or DBR (distributed Bragg reflector) laser can be realized, which has a very narrow frequency spectrum suitable for fiber-optic communications. Finally, any of the conventional growth techniques, such as MBE, MOCVD, VPE, or LPE (liquid phase epitaxy), can be used for the growth of the device, and the charged doping for n-type and p-type layers, which is achieved by conventional techniques, can be interchanged.

The isoelectronically co-doped laser 120 described above has the following advantages:

1) The large conduction band offset induced by N doping helps to confine electrons in the MQW's 135 and minimize electron spill over into the SCH layers 127, 129, and Bi doping can be adjusted to provide just the sufficient amount of valence band offset for confinement of holes in the MQW's 135 to prevent their spillover whilst still allowing for reasonable hole transport across the barriers 136;

2) The ratio of N, Bi, and In doping can be fine tuned to provide a small amount of compressive or tensile strain in the MQW regions 135 for reducing the light hole mass and thereby the threshold current density, temperature sensitivity, chirp, and linewidth;

3) The device structure is aluminum-free, so all the problems associated with the high reactivity of this element and the deletrious consequences on reliability and lifetime in conventional lasers can be avoided; and 4) Since the laser emission 134 essentially occurs from isoelectronic deep donor to deep acceptor level recombination, and since deep levels behave independently of the band edge states, the temperature dependence of the laser wavelength is substantially reduced.

Figure 8:
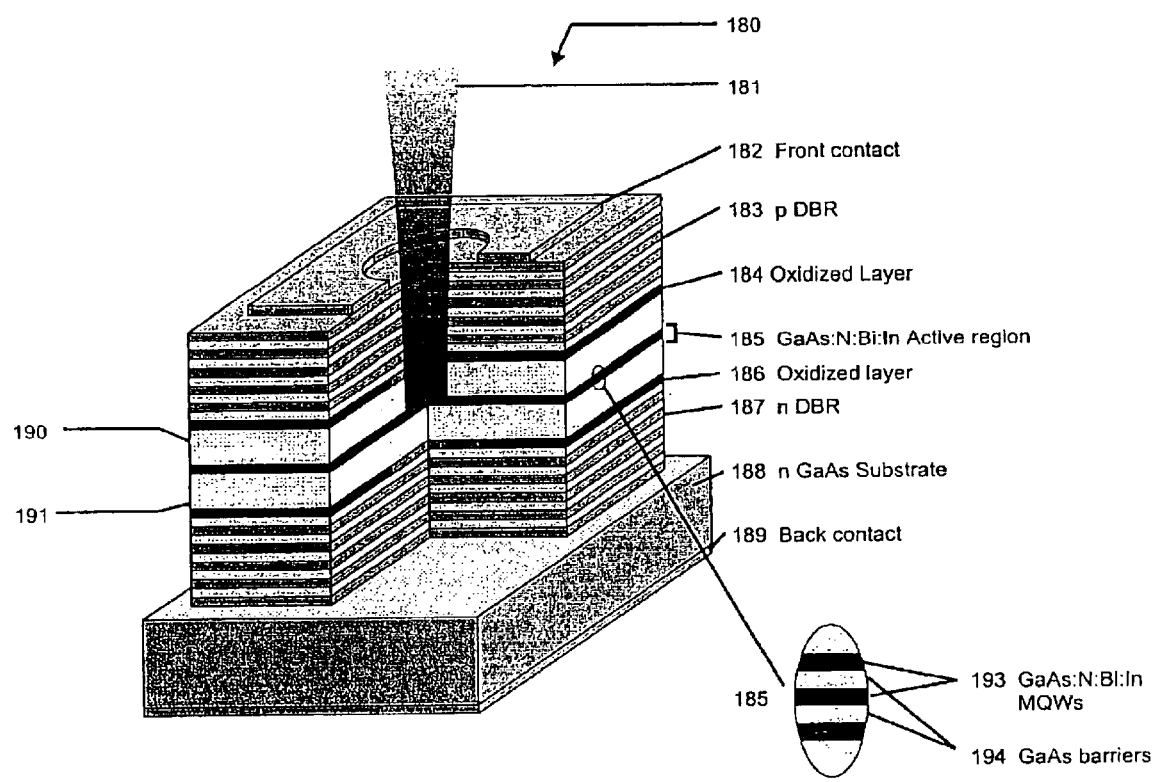
FIG. 8 is an isometric diagrammatic view of a GaAs based VCSEL laser diode application of this invention that produces laser light in preferred fiber optic communication signal wavelengths.

Isoelectronically co-doped GaAs, according to this invention, can also be used to fabricate VCSEL's (Vertical Cavity Surface Emitting Lasers) 180 to operate in the 1.55 µm or 1.3 µm wavelength regions, as shown in FIG. 8. A DBR (distributed Bragg reflector) stack 187 comprising n-type GaAs/Al$_x$Ga$_{1-x}$As alternating layers is grown over an n-type GaAs substrate 188. The topmost layer 186 of the stack is made Al-rich. Next the bottom SCH layer 191 is grown using GaAs. This bottom SCH layer 191 is followed by growth of the active layer 185 (see inset) which comprises a set of multiple quantum wells (MQW) 193 of isoelectronically co-doped GaAs:N:Bi:In, where each well 193 is surrounded by GaAs barriers 194. The amount of isoelectronic co-doping of the MQW's 193 and the MQW 193 well widths are chosen to yield ground state transition energies near 0.8~0.93 eV (1.55 or 1.3 m). The top SCH layer 190 is next grown using GaAs followed by a DBR stack 183 comprising p-type GaAs/Al$_x$Ga$_{1-x}$As alternating layers. The bottommost layer 184 of the DBR stack 183 is made Al-rich. A front metallic contact 182, and a back metallic contact 189 complete the growth. Any of the conventional methods that are well known to persons skilled in the art can be next used to expose the vertical cross-section of the device 180 to a steam environment at a temperature of 400~450° C. for a time designed to oxidize the Al-rich layers 184 and 186 in the DBR stacks 183 and 187 from the periphery, leaving a central, un-oxidized window region through which laser light 181 emanates. The resulting oxidized aperture layer 184, 186 serves as a current blocking layer (CBL). The p-type and n-type regions are obtained by charge doping of GaAs and Al$_x$Ga$_{1-x}$As. The charged doping for the p-type and n-type regions are achieved by conventional techniques and of course the p-type and n-type regions can be interchanged. Other geometries for a VCSEL laser, which require other methods for generating the current blocking, which is the function of oxidized layers 184 and 186, can also be utilized as is within the capabilities of persons skilled in the art. Also, since utilizing two relatively low n-type DBR mirror stacks (instead of one p-type and one n-type as in FIG. 8) reduces the free carrier absorption, which can be excessive at long wavelengths in p-type materials, this can be achieved by introducing a tunnel junction into the high index GaAs layer nearest to the optical cavity 185 in the top output mirror 183. Finally any of the conventional growth techniques, such as MBE or MOCVD, can be used for the growth of the device. Prior to this invention, only VCSEL lasers operating around the 800 nm near-infrared wavelength range were commercially available, because it is very difficult to fabricate the 1.55 µm and 1.3 µm wavelength devices. This limitation is due to the fact that these devices are generally based on the quartenary InGaAsP alloy system that could only be grown lattice matched to InP substrates, and it is very difficult to grow decent DBR stacks using this quartenary alloy. Thus, the InGaAsP based 1.55 and 1.3 µm lasers are generally of the edge-emitting type in instead of the VCSEL type. Since VCSEL lasers offer unique advantages over edge emitting lasers, and GaAs technology is cheaper than InP technology, isoelectronic co-doping of GaAs according to this invention to fabricate the VCSEL 180 proves very advantageous. In addition, the isoelectronically co-doped laser 180 described above has the following advantages:

1) The large conduction band offset induced by N doping helps to confine electrons in the MQW's 193 and minimize electron spill-over into the SCH layers 190, 191, and Bi doping can be adjusted to provide just the sufficient amount of valence band offset for confinement of holes in the MQW's 193 to prevent their spillover whilst still allowing for reasonable hole transport across the barriers 194;

2) The ratio of N, Bi, and In doping can be fine tuned to provide a small amount of compressive or tensile strain in the MQW regions 193 for reducing the light hole mass and thereby the threshold current density, temperature sensitivity, chirp, and linewidth;

3) Since the laser emission 181 essentially occurs from isoelectronic deep donor to deep acceptor level recombination, and since deep levels behave independently of the band edge states, the temperature dependence of the laser wavelength is substantially reduced; and 4) VCSEL's operating at 1.3 or 1.55 µm can be directly grown on GaAs substrates on which the growth of high quality DBR's is simple.

Figure 9:
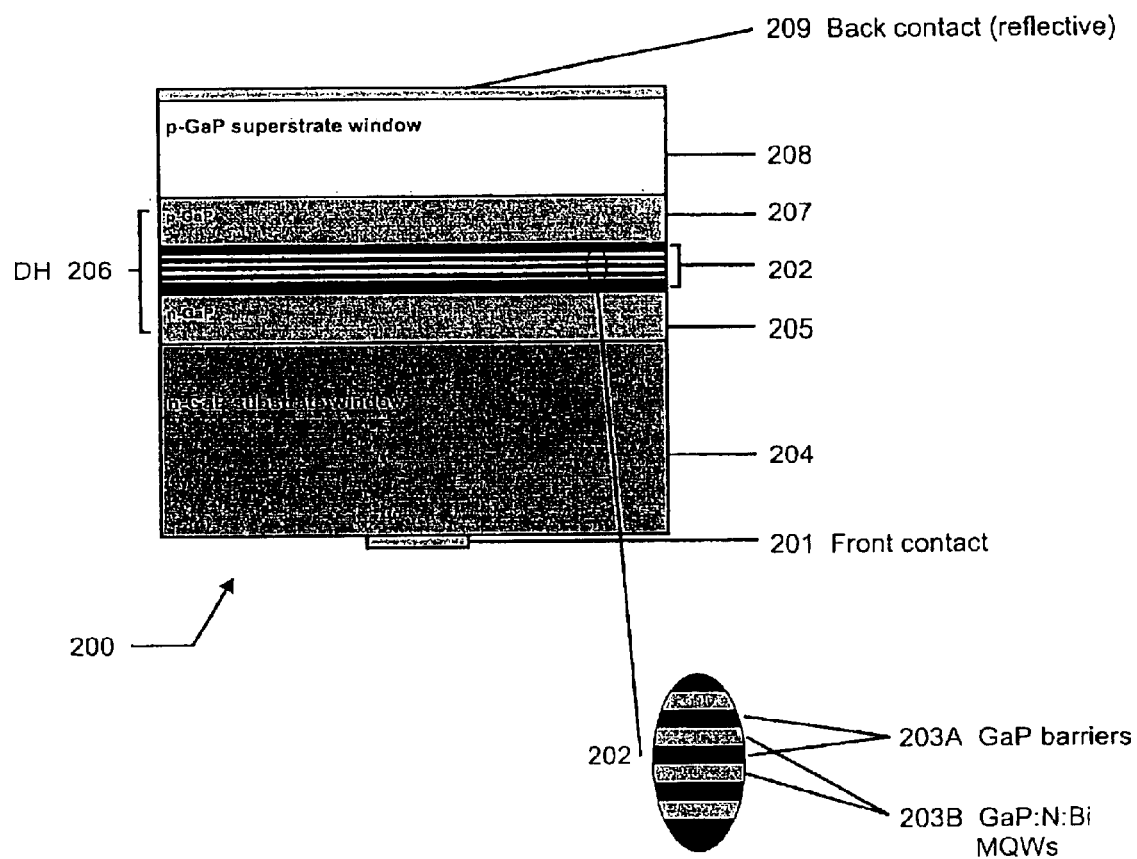
FIG. 9 is an isometric diagrammatic view of a GaP based, high brightness, light emitting diode (LED) application of this invention that produces light in the red and near infra-red (NIR) spectral regions.

Another application of isoelectronic co-doping semiconductor material with deep acceptors and deep donors according to this invention is the ability to grow LED semiconductor devices on GaP or Si substrates. An example of such an application is a Red/NIR (near-infrared), i.e., 640–800 nm wavelength, High-Brightness LED 200 shown in FIG. 9, which comprises an active region 202 of isoelectronically co-doped GaP, according to this invention, with a bandgap chosen to have a value in the range 1.55–1.93 eV to produce Red/NIR light. Isoelectronically co-doping GaP with deep acceptors such as N, and deep donors, such as Bi, can be used to lower the bandgap of GaP to a value in the range 1.55–1.93 eV to produce Red/NIR light whilst regularizing the properties of the alloy (enhancement of carrier mobilities, photoluminescence efficiency, carrier lifetime, and reduced tail states in the bandgap) according to this invention. Since this isoelectronically co-doped system (GaP:N:Bi), according to this invention, can be grown lattice matched to a GaP substrate, the Red/NIR LED 200 in the DH (double heterostructure) configuration 206, along with the n-GaP barrier layer 205, can be grown directly on the n-GaP substrate 204. The active region 202 can be a multiple quantum well (MQW) structure, as shown in FIG. 9, or it can be a single isoelectronically co-doped GaP:N:Bi layer (not shown) for lower cost, albeit lower energy emission, LED devices, as will be understood by persons skilled in the art. The MQW active region 202 comprises multiple, alternating GaP barrier layers 203A and isoelectronically co-doped GaP:N:Bi well layers 203B. The quantum confinement provided by the MQW layers 203A, 203B serves to shift the LED emission toward higher energies and, also, to lower the threshold current. The thick, transparent GaP substrate 204 serves as a thick (>200 µm) top window proving advantageous for simultaneous top and side extraction of light from the device. Moreover, after growth of the structure by MOCVD or MBE, the device can be transferred to a VPE growth system and a thick (≈50 µ) superstrate layer 208 of p-GaP can be grown over the p-GaP barrier layer 207. With a reflecting back contact 209, this structure enables all six cones of light (top, bottom and four side cones) from the device to be extracted. Surface texturing of the top and bottom surfaces can be employed to randomize the reflected light thus diminishing losses due to multiple light bounces through the active region. Details such as contact layers for low resistance contacts are not shown. The n-type and p-type regions are achieved by conventional charged doping and can be grown reversed. Finally, the geometrical shape of the device can easily be configured into the Truncated-Inverted Pyramid (TIP) geometry (as is well within the capabilities of persons skilled in the art) to allow for the maximum light extraction and thus for use in applications requiring High Brightness LED's in the Red/NIR spectral region.

Figure 10:
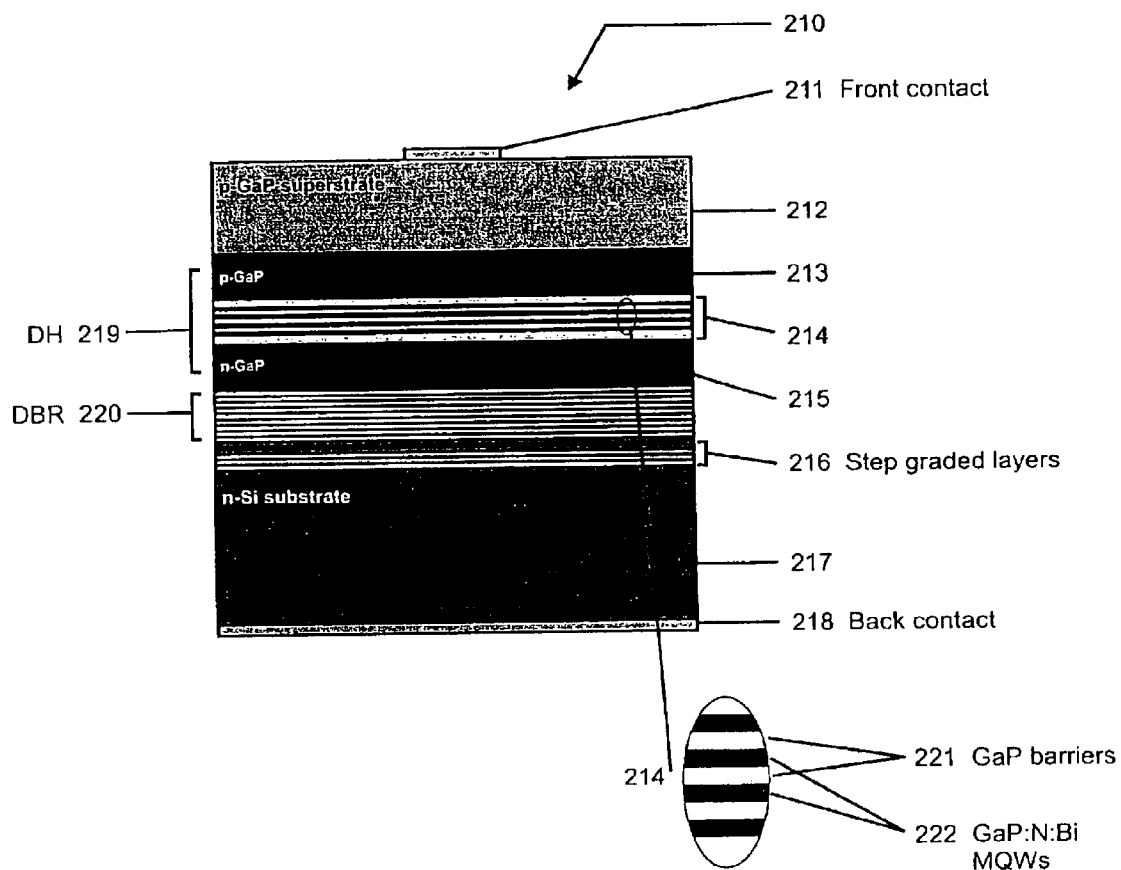
FIG. 10 is an isometric diagrammatic view of a GaP based light emitting diode (LED) grown monolithically on Si that produces light in the red and near infra-red (NIR) spectral regions.

As shown in FIG. 10, isoelectronic co-doping according to this invention can also be used to grow Red/NIR, i.e., 640–800 nm wavelength, LED's 210 monolithically on silicon. The isoelectronic ally co-doped system of the LED 200 described above and illustrated in FIG. 9 can also be grown on a Si substrate 217, as shown in FIG. 10, using a step-graded layer structure 216 to allow for accommodation of the 0.37% compressive mismatch strain between the GaP based DH configuration 219 and the Si substrate 217. As shown in FIG. 10, a step-graded layer structure 216 is first grown over the silicon substrate 217 to accommodate the 0.37% compressive mismatch strain between the GaP based double heterostructure laser 219 with the Si substrate 217. This step-graded layer structure 216 comprises four layers of n-doped $GaP_{1-x-y}N_xBi_y$ grown consecutively over the Si substrate 217 with the composition of N and Bi for each layer adjusted such that the mismatch strain between adjacent layers is about 0.1% for the first three layers, and is about 0.07% between the third and fourth layer of the step graded layers 216. The thickness of the first three layers of the step graded layers 216 is roughly 0.3 $\mu$m and that of the fourth layer is 0.8 $\mu$m. This arrangement allows the final network of misfit dislocations arising from the last composition step-grade to evolve fully, leaving only a very low density of threading dislocations to propagate into the DH configuration layers 219. The active region 214 in this LED 210 can also be either a MQW structure, as shown in FIG. 10, or it can be a single isoelectronically co-doped GaP:N:Bi layer (not shown) for lower cost, albeit lower energy emission, LED devices. An MQW structure for the active region 214 comprises multiple, alternating GaP barrier layers 221 and isoelectronically co-doped GaP:N:Bi well layers 222, which provide quantum confinement to shift LED emission toward higher energies and lower threshold current as compared to a single GaP:N:Bi layer active region. The p-GaP superstrate 212, the DH configuration layers 219, comprising either the single GaP:N:Bi layer active region 214 (not shown) or the MQW active region 214 comprising the multiple, alternating GaP barrier layers 221 and isoelectronically co-doped GaP:N:Bi well layers 222, as well as the p-GaP barrier layer 213 and the n-GaP barrier layer 215, can be grown in a manner that is analogous to the superstrate layer 208 and the DH layer 206 discussed for FIG. 9. However, in contrast to the High Brightness LED 200 of FIG. 9, since the Si substrate 217 of the LED 210 in FIG. 10 is not transparent to the light produced in the active region 214, and, instead will absorb such light. Therefore, only the top and side cones of light emitted from the DH configuration 219 can be extracted. The unique advantage of the LED 210, however, is that it can be grown monolithically on Si, thereby allowing for such devices to be integrated directly with electronic circuits that have been fabricated alongside monolithically. Such monolithic integration of photonics and electronics would be very suitable for applications, such as in integrated transceiver chips for fiber-optic communications and for microdisplays. Further, while it is not necessary to this invention, the disadvantage of light absorption by the Si substrate 217 can be mitigated, and the efficiency of the LED 210 can be enhanced, by forming a distributed Bragg reflector (DBR) 120 comprising multiple, alternating layers of AlP and GaP between the barrier layer 215 and the step-graded layers 216 to reflect light back through the DH structure 219 and superstrate 212 before it reaches the light-absorbing Si substrate 217. Therefore, such reflected light emanates from the front surface of the LED 210 to enhance the energy and brightness of the emitted light instead of being absorbed by the Si substrate 217 and lost as heat. Also, if the LED 210 is to be coupled to an optical fiber (not shown), then the front contact 211 can be moved from the center to the edges, a recess for the fiber (not shown) can be etched into the superstrate 212, and an oxide isolation layer (oxide layer with a central aperture, which could be realized by oxidization of an inserted AlP layer from the periphery) can be inserted between layers 215 and 216 to limit the emitting area of the laser to the area under the fiber.

As opposed to the surface-emitting LED configuration described above, one can also utilize an edge-emitting LED configuration (light emitted from a side cone of LED 210) to couple light into an optical fiber (not shown). The superstrate 212 is then unnecessary and the contact 211 is made to cover the entire top surface. Also the DH structure 219 has to be sandwiched between $Al_xGa_{1-x}P$ cladding layers (high bandgap, low refractive index material) so as to form a wave guide, and a passivation layer of GaP has to be inserted below the top contact. Details, such as contact layers for low resistance contacts, window passivation layers, and buffer layers, are not shown in FIGS. 9 and 10, but are well-known to persons skilled in the art and can be used with this invention. The n-type and p-type regions are achieved by conventional charged doping, and the n-type and p-type regions shown in FIG. 10 can, of course, be grown reversed.

Figure 11:
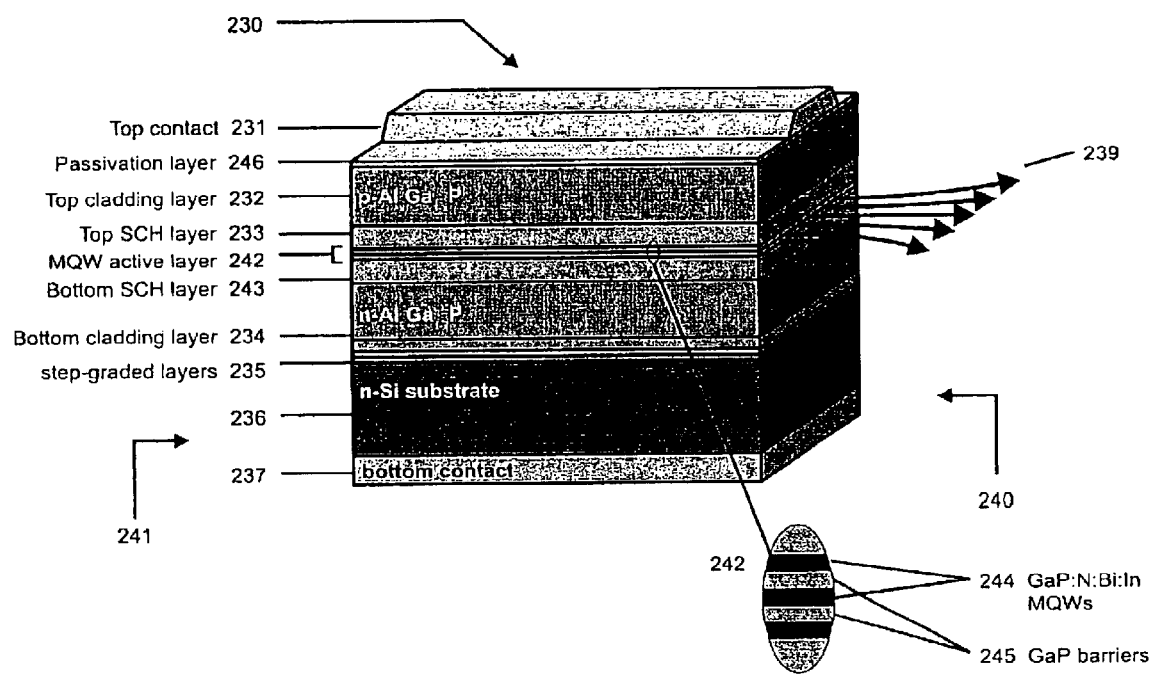
FIG. 11 is a diagrammatic cross sectional view of a GaP based edge-emitting laser grown monolithically on Si that produces laser light in the red and NIR regions.

As shown in FIG. 11, isoelectronic co-doping according to this invention can also be used to fabricate a semiconductor diode, edge-emitting laser 230 on a Si substrate, which operates in the visible/NIR wavelength regions, i.e., 640–800 nm wavelengths. Step-graded layers 235 can be grown over the Si substrate 236 analogously as was done for the LED device 210 in FIG. 10, to accommodate the 0.37% compressive mismatch strain between the Si substrate 236 and an n-type $Al_xGa_{1-x}P$ bottom cladding layer (low refractive index optical confining layer) 234 lattice matched to a bottom GaP separate confinement heterostructure (SCH) layer 243. The active region 242 (see inset in FIG. 11) comprises a set of multiple quantum wells (MQW) 244 of isoelectronic co-doped GaP:N:Bi:In according to this invention, where each well 244 is surrounded by GaP barriers 245. The amount of isoeleclectronic co-doping of the MQW's 244 and the MQW 244 well widths are chosen to yield MQW 244 ground state transition energies near 1.55–1.93 eV (640–800 nm). The GaP top SCH layer 233 is then grown followed by the top p-type $Al_xGa_{1-x}P$ cladding layer 232, a GaP surface passivation layer 246, and a top contact stripe 231. The overall structure is that of a p-i-n diode. When a voltage is applied to the top contact 231 and bottom contact 237 to forward bias the p-i-n diode, the barriers 245 in the MQW's 244 provide quantum confinement for the electrons and holes injected from the n-type 234 and p-type 232 regions, respectively, under the forward bias into the MQW active region 242. The cladding layers 232 and 236 provide optical confinement for the radiation emitted as a result of the recombination of the injected electrons and holes in the MQW's 244. The thickness of the top and bottom separate confinement heterostructure (SCH) layers 233 and 243 is of the order of an optical wavelength, thereby confining in the transverse direction the optical Fabry-Perot cavity bounded longitudinally by the front and rear mirrors formed by the cleaved faces 240 and 241, respectively. The mirrors 240, 241 may be coated to increase or decrease their reflectivity to produce and emit a laser beam 239 from an edge of the MQW active layer 242. Carrier flow in the vertical direction follows the contour defined by the lateral stripe shape of the top contact 231. Thus, the lasing area is limited in the lateral direction to the stripe region defined by the top contact 231, because of gain guiding. Details such as contact layers for low resistance contacts and buffer layers are well-known to persons skilled in the art, thus are not shown here.

The edge-emitting laser 230 in FIG. 11 illustrates the most basic edge-emitting laser configuration. The alloy composition of the SCH layers 233, 243 may be linearly, parabolically, or step graded as in GRINSCH (graded index separate confinement heterostructure) lasers (here one would use $Al_xGa_{1-x}P$ for the cladding layers 232, 234 and grade the composition of x from x=0 to the value of x in the cladding layers 232, 234). Other techniques of defining the stripe geometry for limiting the lateral width of the lasing area can also be used, such as those employed for the ridge-waveguide laser configuration or by using index guiding as for the buried heterostructure (BH) laser configuration or by forming narrow mesas or inverse mesa geometry structures. Many techniques, such as the use of reverse biased diodes as lateral current blocking layers, or oxide or polymide insulating layers or deeply etched recesses for lateral isolation and lowering of parasitic capacitances, can be used as is within the capabilities of those familiar with the art. Also, as is well within the capabilities of those familiar with the art, by inserting a grating profile layer at the bottom or top interface of the cladding layers 232 or 234, a DFB (distributed feedback) laser or DBR (distributed Bragg reflector laser) can be realized which has a very narrow frequency spectrum suitable for fiber-optic communications. Finally, any of the conventional growth techniques, such as MBE or MOCVD or VPE or LPE, can be used for the growth of the device, and the charged doping for n-type and p-type layers, which is achieved by conventional doping techniques, can be reversed.

The isoelectronically co-doped laser 230 described above has the following advantages:

1) The large conduction band offset induced by N doping helps to confine electrons in the MQW's 244 and minimize electron spill over into the SCH layers 233 and 243, and Bi doping can be adjusted to provide just the sufficient amount of valence band offset for confinement of holes in the MQW's 244 to prevent their spillover whilst still allowing for reasonable hole transport across the barriers 245;
2) The ratio of N, Bi, and In doping can be fine tuned to provide a small amount of compressive or tensile strain in the MQW regions 244 for reducing the light hole mass and thereby the threshold current density, temperature sensitivity, chirp, laser linewidth, and Auger recombination; and
3) Since the laser emission 239 essentially occurs from isoelectronic deep donor to deep acceptor level recombination, and since deep levels behave independently of the band edge states, the temperature dependence of the laser wavelength is substantially reduced.

The devices 200, 210, 230 shown in FIGS. 9, 10, and 11 all have isoelectronically co-doped GaP:N:Bi or GaP:N:Bi:In active regions 202, 214, 242, and adding Al to these active regions will raise the bandgap and hence the light emission energy slightly toward the orange or yellow bands, but will not change the lattice size. Thus, Al can be added to all the GaP DH layers/active layers 202, 214, 242 for these cells 200, 210, 230, including the MQW barrier layers 203A, 221, 245, and the MQW active layers 203B, 222, so as to tune the emission wavelength slightly toward the orange or yellow bands, if desired. The quantum confinement induced upshift in the light emission energy induced by the MQW active region can also be utilized for lowering the emission wavelength. Consequently, the laser 230 in FIG. 11 could also be used in applications where lasers with short wavelengths are required, such as in compact disc (DC) memory devices, as well as in many other applications. Therefore, GaP:N:Bi, GaP:N:Bi:In, GaP:N:Bi:Al, and GaP:N:Bi:In:Al for the active layers 202, 214, 242 are considered to be equivalents for purposes of this invention.

Figure 12:
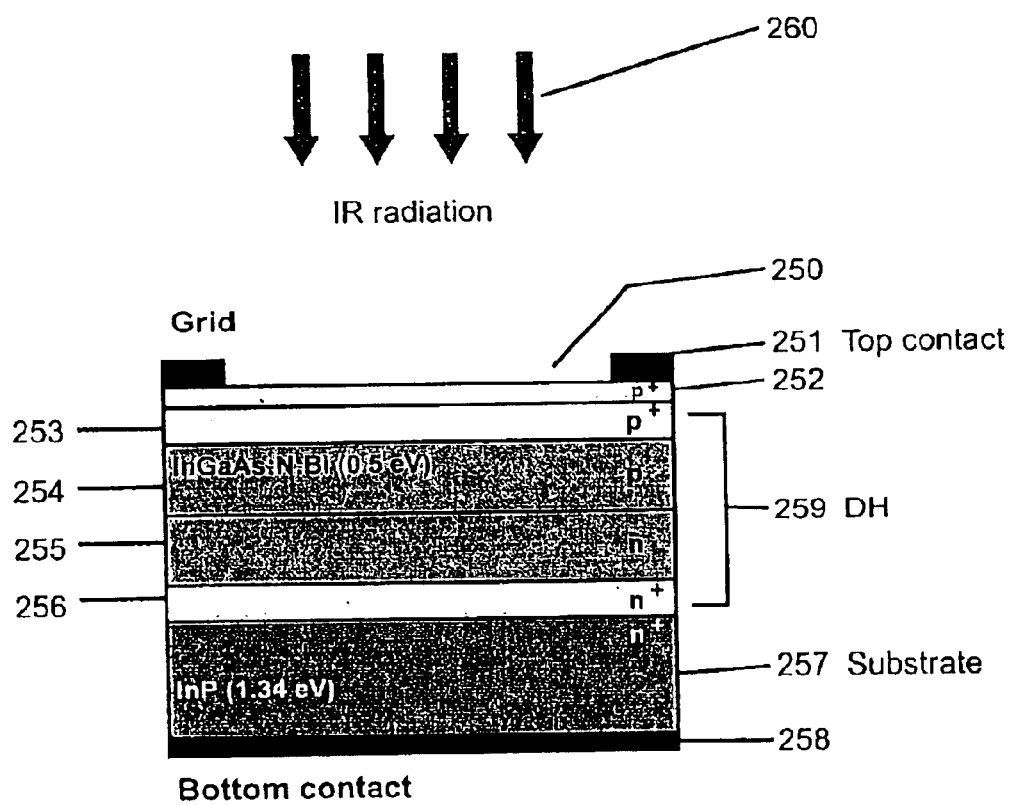
FIG. 12 is a diagrammatic cross sectional view of a thermal photovoltaic (TPV) cell application of this invention.

Isoelectronic co-doping according to this invention can also be used advantageously in the area of Thermal Photovoltaics (TPV), where the source of radiant energy is blackbody radiation from a thermally heated source. The optimal bandgap of a TPV cell is 0.5 eV for absorption from a 1000K heat source. Prior to this invention, the best TPV cells were based on growing $In_xGa_{1-x}As$ on InP substrates with x chosen such that the bandgap of th $In_xGa_{1-x}As$ alloy was 0.5 eV. However, at this composition of x=0.22, $In_xGa_{1-x}As$ is lattice mismatched to InP. Therefore, it has been necessary to resort to difficult growth procedures, such as growth of a sequence of step-graded layers in between the InP substrate and the TPV device active layer so as to distribute the mismatch strain by the consequent strain grading. However, that technique results in thicker and more complex structures. A thermal photovoltaic cell (TPV) 250 comprising an isoelectronic co-doped semiconductor material according to this invention is illustrated in FIG. 12. This cell 250 circumvents the difficulties encountered in growing the $In_xGa_{1-x}As$ TPV cell mentioned above. The TPV cell 250 in this example comprises an isoelectronic co-doped InGaAs:N:Bi cell in a double heterostructure (DH) configuration 259 grown lattice matched to an n$^+$ InP substrate 257. The active absorbing region comprises a p-n junction made up of p-type layer 254 of isoelectronically co-doped InGaAs:N:Bi and a n-type layer 255 of isoelectronic co-doped InGaAs:N:Bi, where the amount of co-doping is adjusted to lower the bandgap of InGaAs from the value 0.75 eV, for which it is lattice matched to InP, to a value 0.5 eV, whilst maintaining lattice matching to InP. The cell p-n junction active layer is sandwiched in the DH configuration 259 by p$^+$ and n$^+$ barrier layers 253, 256 of InGaAs at the composition for which this alloy is lattice matched to InP. The epilayer 253 serves as a widow/passivation layer and the epilayer 256 as a BSR layer. A p$^+$ InGaAs layer 252 to facilitate low resistance contacts and metallic contact layers 251 (a grid) and 258 complete the TPV cell device 250 structure. All the epitaxial layers 252–257 are grown lattice matched to the InP substrate 257. The growth can be accomplished using MBE, MOCVD, or VPE techniques, and the charged doping for n-type and p-type layers, which is achieved by conventional doping techniques, can be reversed. Also, since the InP substrate 257 is transparent (it has a bandgap of 1.34 eV) to radiation absorbed by the cells active region 254, 255, the top (grid) contact 251 and bottom contact 258 can be interchanged, i.e., the radiant heat energy 260 can be absorbed through the substrate 257 from below. Also, an additional InP:N:Bi isoelectronically co-doped bottom cell operating in tandem to the top cell 259 can be inserted monolithically between the top cell 259 and the substrate 257. Such additional bottom cell will have an active region p-n junction comprising p-type InP:N:Bi and n-type LnP:N:Bi epilayers for which the amount of isoelectronic co-doping is adjusted to lower the bandgap of InP to a suitable value in the range 0.6 to 0.75 eV (for optimal tandem cell performance), whilst maintaining lattice matching to the InP substrate 258. Of course, a tunnel junction will have to be inserted between epilayer 256 and the InP:N:Bi cell. Also, the InP:N:Bi cell could be heavily isoelectronically co-doped to lower its bandgap to 0.5 eV and then the top $In_xGa_{1-x}As$ cell can be eliminated altogether, thus providing for a convenient single cell TPV device. Finally, although not shown in FIG. 12, a plasma reflector layer which serves as a thermal mirror to reflect way radiant energy whose wavelength lies outside the spectral absorption region of the TPV cell active region (and to thus minimize heating effects) can be grown as the top layer of the cell.

Figure 13:
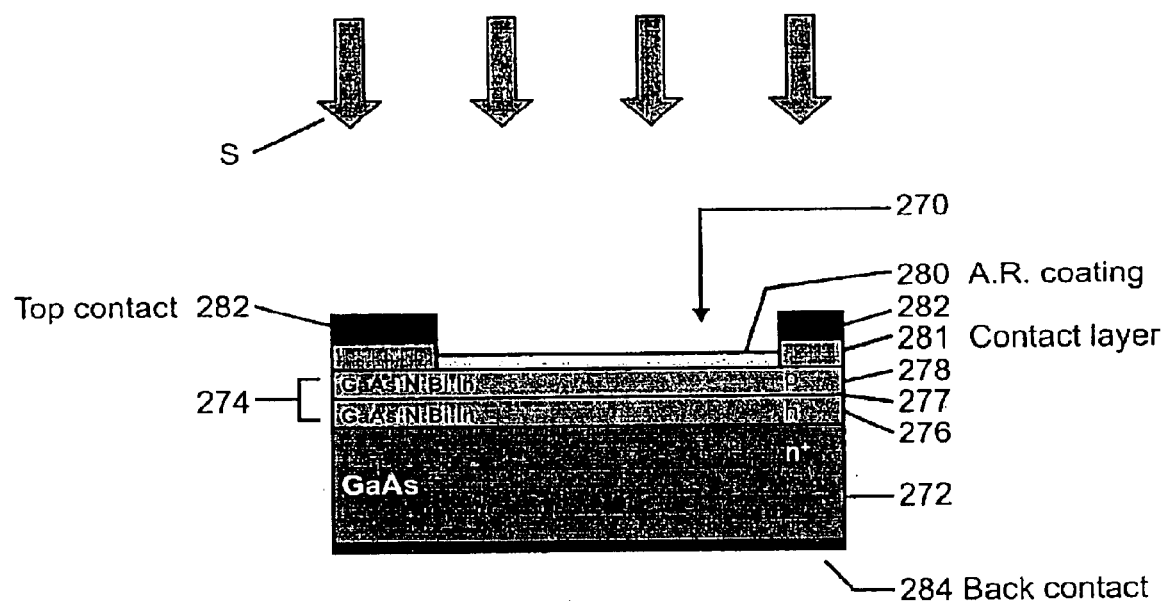
FIG. 13 is a diagrammatic cross sectional view of a photodetector application of this invention.

Of course, an LED operating in reverse is a photodetector. The difference in the two device structures primarily lies in their optimization. LED structures are optimized for light extraction, whereas photodetectors are optimized for either high speed operation or low noise operation, and the design principles for obtaining such characteristic features are very well established. Further, although very good InGaAs based photodetectors on InP substrates are already available for fiber optic communication applications (1.3–1.55 µm), the unique advantage of isoelectronic co-doping according to this invention may be realized in the fact that photodetectors utilizing isoelectronically co-doped GaAs:N:Bi:In for their active regions can be grown on GaAs substrates as opposed to InP substrates. For example, as illustrated diagrammatically in FIG. 13, a basic GaAs:N:B:In photodetector 270 is fabricated on a GaAs substrate 272. The active layer 274 is isoelectronically co-doped with N and Bi to absorb the desired light wavelength, for example, 1.3 µm or 1.55 µm, as described above. Such an isoelectronically co-doped GaAs:N:BI:In active layer 274 can, of course, also be charged doped in a conventional manner to produce the n-type GaAs:N:Bi:In layer 276 and to produce the p-type GaAs:N:Bi:In layer 278, or vice versa, deposited on the GaAs substrate 272 for the p-n junction 277. An appropriate window layer 280, an anti-reflective coating 281, top contacts 282, and a bottom contact 284 can be added to complete the photodiode 270. Of course, other embellishments and variations of such basic photodiode structure would be well within the capabilities of persons skilled in the art once the isoelectronic co-doping of semiconductor compounds or alloys of this invention is understood.

For all the devices mentioned above, the isoelectronic co-doping enhances the solubility of the isoelectronic dopants (allowing for the lowering of the semiconductor bandgap to the optimal chosen value), increases the carrier mobility, decreases the carrier effective mass, and enhances the photoluminescence efficiency and lifetime leading to highly improved device performance. Also, it is well-known in the art that In can be added to the cation sublattice or As can be added to the anion sublattice of Group III–V semiconductor compounds or alloys to adjust lattice size. Such addition of In and/or As, usually not more than about 5 at. % of the respective anion or cation sublattice, can be used in any of the isoelectronically co-doped Group III–V compounds or alloys described above for this invention where adjustment of lattice size is needed or desired, for example, to accommodate independent optimization of the isoelectronic co-dopants while maintaining or achieving desired lattice matching constraints. Therefore, addition of In and/or As to any of the isoelectronically co-doped Group III–V compounds or alloys of this invention, as described above, is considered to be part of this invention. It would be unnecessarily cumbersome to list all such variations in the description or claims for each embodiment. Consequently, for convenience in describing and claiming this invention, references herein to GaAs:N:Bi and GaP:N:Bi are considered to also cover such variations as GaAs:N:Bi:In, and references herein to GaP:N:Bi are considered to also cover such variations as GaP:N:Bi:In and GaP:N:Bi:As.

Unless otherwise stated, the word "about", when used with a bandgap means within 0.2 eV, when used with at. % means within 1.0 at. %, when used with wavelength means within 0.1 µm, and when used with temperature means within 50° C. Also, when an atomic species in the nomenclature of a semiconductor compound or alloy is separated by a colon from other atomic species, e.g., the N and Bi in GaAs:N:Bi, such atomic species separated by a colon are considered to comprise a very small percentage of the alloy or compound, i.e., about 6 at. % or less, and such nomenclature is sometimes used herein for convenience, but not necessarily for limitation.

Since numerous modifications and combinations of the above method and embodiments will readily occur to persons skilled in the art, it is not desired to limit the invention to the exact construction and process shown and described above. Accordingly, resort may be made to all suitable modifications and equivalents that fall within the scope of the invention as defined by the claims which follow. The words "comprise," "comprises," "comprising," "include," "including," and "includes" when used in this specification and in the following claims are intended to specify the presence of stated features, structures, or steps, but they do not preclude the presence or addition of one or more other features, structures, steps, or groups thereof.

The embodiments of the invention in which an exclusive property or privilege is claimed are defined as follows:

1. A method of modifying a semiconductor compound or alloy comprising host atoms in a host crystal lattice to have a lower effective bandgap than the semiconductor compound or alloy has prior to modification, comprising:

isoelectronically co-doping the semiconductor compound or alloy with a first isoelectronic dopant comprising atoms that form isoelectronic electron traps in the host crystal lattice that behave as deep acceptors and with a second isoelectronic dopant comprising atoms that form isoelectronic hole traps in the host crystal lattice that behave as deep donors, such that content of the first isoelectronic dopant in the semiconductor compound or alloy is more than 1 at. % and content of the second isoelectronic dopant in the semiconductor compound or alloy is more than 1 at. %.

2. The method of claim 1, wherein the semiconductor compound or alloy comprises Group III and V host atoms.

3. The method of claim 2, wherein the first isoelectronic dopant comprises Group V or Group III atoms and the second isoelectronic dopant comprises Group V or Group III atoms.

4. The method of claim 3, wherein the Group III and V host atoms comprise Ga and As.

5. The method of claim 4, wherein the first isoelectronic dopant comprises N and the second isoelectronic dopant comprises Bi.

6. The method of claim 5, wherein content of the N in the semiconductor compound or alloy is more than 3 at. % and content of the Bi in the semiconductor compound or alloy is more than 3 at. % of the crystal lattice.

7. The method of claim 3, wherein the Group III and V host atoms comprise In and P.

8. The method of claim 7, wherein the first isoelectronic dopant comprises N and the second isoelectronic dopant comprises Bi.

9. The method of claim 8, wherein content of the N in the semiconductor compound or alloy is more than 3 at. % and content of the Bi in the semiconductor compound or alloy is more than 3 at. %.

10. The method of claim 3, wherein the Group III and V host atoms comprise Ga and P.

11. The method of claim 10, wherein the first isoelectronic dopant comprises N and the second isoelectronic dopant comprises Bi.

12. The method of claim 3, wherein the Group III and V host atoms comprise Al, Ga, and P.

13. The method of claim 12, wherein the first isoelectronic dopant comprises N and the second isoelectronic dopant comprises Bi.

14. The method of claim 3, wherein the Group III and V host atoms comprise In, Ga, and As.

15. The method of claim 14, wherein the first isoelectronic dopant comprises N and the second isoelectronic dopant comprises Bi.

16. The method of claim 1, wherein the semiconductor compound or alloy comprises Group II and VI host atoms.

17. The method of claim 16, wherein the first isoelectronic dopant comprises Group VI atoms and the second isoelectronic dopant comprises Group VI atoms.

18. The method of claim 16, wherein the semiconductor alloy comprises Zn and Se host atoms.

19. The method of claim 17, wherein the first isoelectronic dopant comprises O and the second isoelectronic dopant comprises Te.

20. The method of claim 16, wherein the first isoelectronic dopant comprises Group II atoms and the second isoelectronic dopant comprises Group VI atoms.

21. A method of modifying a Group III–V semiconductor compound or alloy to have a lower effective bandgap than the Group III–V semiconductor compound or alloy has prior to modification, comprising:
   isoelectronically co-doping the Group III–V compound or alloy with more than 1 at. % of a deep acceptor element and more than 1 at. % of a deep donor element.

22. The method of claim 21, including isoelectronically co-doping the Group III–V compound or alloy with more than 3 at. % of a deep donor element and more than 3 at. % of a deep acceptor element.

23. The method of claim 21, wherein the deep acceptor element is a Group V element and the deep donor element is a group V element.

24. The method of claim 23, wherein the Group III–V semiconductor alloy comprises GaAs, the deep acceptor element is N, and the deep donor element is Bi.

25. The method of claim 23, wherein the Group III–V semiconductor alloy comprises InP, the deep acceptor element is N, and the deep donor element is Bi.

26. The method of claim 23, wherein the Group III–V semiconductor alloy comprises GaP.

27. The method of claim 26, wherein the deep acceptor element is N and the deep donor element is Bi.

28. A semiconductor material for use as an active cell in a semiconductor device, the material comprising:
   a semiconductor compound or alloy comprising host atoms in a host crystal lattice with an effective bandgap that is modified by isoelectronic co-doping with more than 1 at. % of a first isoelectronic dopant comprising atoms that form isoelectronic traps in the host crystal lattice that behave as deep acceptors and more than 1 at. % of a second isoelectronic dopant comprising atoms that form isoelectronic traps in the host crystal lattice that behave as deep donors to lower the effective bandgap of the semiconductor material.

29. The semiconductor material of claim 28, wherein content of said first isoelectronic dopant in the semiconductor compound or alloy is more than 3 at. % and content of said second isoelectronic dopant in the semiconductor compound or alloy is more than 3 at. %.

30. The semiconductor material of claim 28, wherein the semiconductor alloy comprises Group III and V host atoms.

31. The semiconductor material of claim 30, wherein the first isoelectronic dopant comprises Group V or Group III atoms and the second isoelectronic dopant comprises Group V or Group III atoms.

32. The semiconductor material of claim 31, wherein the Group III and Group V host atoms comprise Ga and As.

33. The semiconductor material of claim 32, wherein the first isoelectronic dopant comprises N and said second isoelectronic dopant comprises Bi.

34. The semiconductor material of claim 31, wherein the Group III and Group V host atoms comprise In and P.

35. The semiconductor material of claim 34, wherein the first isoelectronic dopant comprises N and the second isoelectronic dopant comprises Bi.

36. The semiconductor material of claim 31, wherein the Group III and Group V host atoms comprise Ga and P.

37. The semiconductor material of claim 36, wherein the first isoelectronic dopant comprises N and the second isoelectronic dopant comprises Bi.

38. The semiconductor material of claim 31, wherein the Group III and Group V host atoms comprise Al, Ga, and P.

39. The semiconductor material of claim 38, wherein the first isoelectronic dopant comprises N and the second isoelectronic dopant comprises Bi.

40. The semiconductor material of claim 31, wherein the Group III and Group V host atoms comprise In, Ga, and As.

41. The semiconductor material of claim 40, wherein the first isoelectronic dopant comprises N and the second isoelectronic dopant comprises Bi.

42. The semiconductor material of claim 28, wherein the semiconductor alloy comprises Group II and Group VI host atoms.

43. The semiconductor material of claim 42, wherein the first isoelectronic dopant comprises Group VI atoms and the second isoelectronic dopant comprises Group VI atoms.

44. The semiconductor material of claim 42, wherein the first isoelectronic dopant comprises Group II atoms and the second isoelectronic dopant comprises Group VI atoms.

45. The semiconductor material of claim 43, wherein the Group II and Group VI host atoms comprise Zn and Se.

46. The semiconductor material of claim 45, wherein the first isoelectronic dopant comprises O and the second isoelectronic dopant comprises Te.

47. A monolithic, quadruple junction solar cell, comprising:
   a first cell comprising Ge with a bandgap of about 0.67 eV;
   a second cell comprising GaAs that is isoelectronically co-doped with a deep acceptor element and a deep donor element to have an effective bandgap of about 1.05 eV on the first cell;
   a third cell comprising GaAs with a bandgap of about 1.42 eV on the second cell; and
   a fourth cell comprising InGaP with a bandgap of about 1.90 eV on the third cell.

48. The monolithic, quadruple junction solar cell of claim 47, wherein a Ge substrate comprises the first cell.

49. The monolithic, quadruple junction solar cell of claim 48, wherein the Ge first cell has a charge-doped n-p junction, the isoelectronically co-doped GaAs second cell has a charge-doped n-p junction, the GaAs third cell has a charge-doped n-p junction, and the InGaP fourth cell has a charge-doped n-p junction.

50. The monolithic, quadruple junction solar cell of claim 49 including a $p^{++}$-$n^{++}$ doped Ge tunnel junction between the first cell and the second cell, a $p^{++}$-$n^{++}$ doped tunnel junction of isoelectronically co-doped GaAs between the second cell and the third cell, and a $p^{++}$-$n^{++}$ doped GaAs tunnel junction between the third cell and the fourth cell.

51. The monolithic, quadruple junction solar cell of claim 50, wherein the n-p junctions comprising the second and third cells are sandwiched between BSR layers, each of said BSR layers having a higher bandgap than the respective p-n junction it sandwiches.

52. The monolithic, quadruple junction solar cell of claim 50, wherein the n-p junction of the fourth cell is sandwiched between a n-type AlInP window layer and a BSR layer.

53. The monolithic, quadruple junction solar cell of claim 50, including a conductive bottom contact under the substrate and a conductive top contact on the fourth cell.

54. The monolithic, quadruple junction solar cell of claim 32, wherein the deep acceptor element is N and the deep donor element is Bi to form GaAs:N:Bi crystal lattice.

55. The monolithic, quadruple junction solar cell of claim 54 wherein content of the N in the GaAs:N:Bi crystal lattice is about 2 at. % and content of the Bi in the GaAs:N:Bi crystal lattice is about 3.8 at. %.

56. A two-junction tandem solar cell, comprising:
a bottom cell comprising a Si substrate with a bandgap of about 1.1 eV and that has a charge-doped junction; and
a top cell on the bottom cell, said top cell comprising GaP that is isoelectronically co-doped with a deep acceptor element and a deep donor element to have an effective bandgap of about 1.75 eV and that has a charge-doped-junction.

57. The two-junction tandem solar cell of claim 56, wherein said bottom cell and said top cell are monolithic, said bottom cell has a charge-doped p-n junction, and said top cell has a charge-doped p-n junction.

58. The two-junction tandem solar cell of claim 56, including a charge-doped Si tunnel junction between the Si bottom cell and the isoelectronically co-doped GaP top cell.

59. The two-junction tandem solar cell of claim 57, wherein the top cell p-n junction is sandwiched between a top GaP window layer and a bottom BSR layer of GaP:N:Bi.

60. The two-junction tandem solar cell of claim 59, wherein said bottom BSR layer of GaP:N:Bi has a higher bandgap than the top p-n junction.

61. The two-junction tandem solar cell of claim 58, including a bottom conductive contact under the Si substrate and a top conductive contact on the top cell.

62. The two-junction tandem solar cell of claim 58, wherein the deep acceptor element is N and the deep donor element is Bi to form an isoelectronically co-doped GaP:N:Bi crystal lattice that is lattice matched to the Si substrate.

63. The two-junction tandem solar cell of claim 62, wherein content of the N in the GaP:N:Bi crystal lattice is about 5 at. % and content of the Bi in the GaP:N:Bi crystal lattice is about 2.2 at. %.

64. A three-junction tandem solar cell, comprising:
a first cell comprising a Si substrate with a bandgap of about 1.1 eV and that has a charge-doped junction;
a second cell on said first cell, said second cell comprising GaP that is isoelectronically co-doped with a deep acceptor element and a deep donor element to have an effective bandgap of about 1.55 eV and that has a charge-doped p-n junction; and
a third cell on said second cell, said third cell comprising GaP that is isoelectronically co-doped with a deep acceptor element and a deep donor element to have an effective bandgap of about 2.05 eV and that has a charge-doped p-n junction.

65. The three-junction tandem solar cell of claim 64, wherein the first cell has a charge-doped p-n junction, and the second cell has a charge-doped p-n junction.

66. The three-junction tandem solar cell of claim 65, including a charge-doped Si tunnel junction between the Si first cell and the isoelectronically co-doped GaP second cell and also including a charge-doped tunnel junction of isoelectronically co-doped GaP between the isoelectronically co-doped GaP second cell and the isoelectronically co-doped GaP third cell.

67. The three-junction tandem solar cell of claim 66, wherein the p-n junction comprising the second cell is sandwiched between BSR layers, and the p-n junction comprising the third cell is sandwiched between a top window layer and a BSR layer.

68. The three-junction tandem solar cell of claim 66, including a bottom conductive contact under the Si substrate and a top conductive contact on the third cell.

69. The three-junction tandem solar cell of claim 64, wherein the deep acceptor element in the second cell is N and the deep donor element in the second cell is Bi to form a GaP:N:Bi crystal lattice.

70. The three-junction tandem solar cell of claim 69, wherein content of the N in the GaP:N:Bi crystal lattice of the second cell is about 5 at. % and content of the Bi in the GaP:N:Bi crystal lattice of the second cell is about 2.2 at % of the GaP:N:Bi crystal lattice of the second cell.

71. The three-junction tandem solar cell of claim 69, wherein the isoelectronically co-doped GaP:N:Bi crystal lattice of the second cell is lattice matched to the Si substrate.

72. The three-junction tandem solar cell of claim 64, wherein the deep acceptor element in the third cell is N and the deep donor element in the third cell is Bi to form GaP:N:Bi crystal lattice.

73. The three-junction tandem solar cell of claim 72, wherein content of the N in the GaP:N:Bi crystal lattice of the third cell is about 7 at % and content of the Bi in the GaP:N:Bi crystal lattice of the third cell is about 4.5 at %.

74. A method of fabricating thin film GaP semiconductor material on a Si crystal lattice, comprising:
depositing a thin film of GaP at a temperature of at least about 700° C. on the Si crystal lattice to achieve two-dimensional growth of polar GaP on non-polar Si;
prior to cooling the thin film of GaP and the Si crystal lattice to room temperature, isoelectronically co-doping the thin film of GaP with a deep acceptor element and a deep donor element in a proportion that reduces compressive misfit strain of the GaP on the Si crystal lattice; and
cooling the thin film of isoelectronically co-opted thin film of GaP and Si crystal lattice to room temperature as the misfit compressive strain reduces to a residual misfit strain of the isoelectronically co-doped GaP on the Si crystal lattice at room temperature that is of lesser magnitude than the compressive misfit strain of the GaP on the Si crystal lattice would be without such isoelectronic co-doping.

75. The method of claim 74, wherein the Si crystal lattice is a miscut Si crystal lattice.

76. The method of claim 74, wherein the residual misfit strain of the isoelectronically co-doped GaP on the Si crystal lattice is tensile.

77. The method of claim 75, including isoelectronically co-doping the GaP with sufficient deep acceptor element and deep donor element to change compressive lattice mismatch between the GaP and the Si to enough tensile lattice mismatch to offset additional compressive lattice mismatch strain that occurs while heating the Si crystal lattice and depositing GaP at a temperature of about 700° C.

78. The method of claim 77, wherein said deep acceptor element is N and said deep donor element is Bi to form GaP:N:Bi crystal lattice.

79. The method of claim 78, wherein content of the N in the GaP:N:Bi crystal lattice is about 6 at. % and content of the Bi in the GaP:N:Bi crystal lattice is about 3.5 at. %.

80. A method of modifying indirect bandgap GaP to act like a direct bandgap semiconductor material, comprising:
isoelectronically co-doping GaP with N and Bi to form a GaP:N:Bi crystal lattice such that content of the N in the GaP:N:Bi crystal lattice is more than 3 at. % and content of the Bi in the GaP:N:Bi is more than 2 at. %.

81. A light-emitting diode, comprising:
an active layer of GaP that is modified by isoelectronically co-doping the GaP with sufficient concentrations of N and Bi to comprise GaP:N:Bi with a lower effective bandgap in a range of about 1.55 eV to 1.93 eV, said active layer being sandwiched between: (i) a first barrier layer of GaP charged-doped to either n-type or p-type; and (ii) a second barrier layer of GaP charged-doped to either n-type or p-type, whichever is opposite the charge-doped first barrier layer.

82. The light-emitting diode of claim 81, wherein content of the N in the GaAs:N:Bi crystal lattice is in a range of about 2–7 at. % and content of the Bi in the GaAs:N:Bi crystal lattice is in a range of about 2–7 at. %.

83. The light-emitting diode of claim 82, wherein the active layer, first barrier layer, and second barrier layer are sandwiched between a n-GaP substrate window and a p-GaP superstrate window, and there is front contact on the superstrate window and a reflective back contact on the superstrate window.

84. The light-emitting diode of claim 83, wherein the active layer comprises a MQW structure including multiple, alternating well layers of isoelectronically co-doped GaP:N:Bi and barrier layers of GaP.

85. The light-emitting diode of claim 83, wherein the GaP substrate window has a textured surface from which light is emitted.

86. The light-emitting diode of claim 82, wherein the active layer, first barrier layer, and second barrier layer are sandwiched between a Si substrate and a GaP superstrate with a step-graded layer structure disposed between the first barrier layer and the Si substrate.

87. The light-emitting diode of claim 86, wherein the step-graded layer structure includes four $GaP_{1-x-y}N_xBi_y$ with the N and Bi for each layer adjusted for desired mismatched strain between adjacent layers.

88. The light-emitting diode of claim 87, wherein the step-graded layer structure includes four $GaP_{1-x-y}N_xBi_y$ layers grown consecutively over the Si substrate with the N and Bi content adjusted in each such that mismatch strain between adjacent layers of $GaP_{1-x-y}N_xBi$ is about 0.1% for the first three $GaP_{1-x-y}N_xBi_Y$ layers and about 0.07% between the third and fourth layers of $GaP_{1-x-y}N_xBi_y$.

89. The light-emitting diode of claim 86, including a distributed Bragg reflector positioned between the first barrier layer and the step-graded layer structure.

90. The light-emitting diode of claim 89, wherein the distributed Bragg reflector comprises multiple, alternating layers of AlP and GaP.

91. The light-emitting diode of claim 86, wherein the active layer comprises a MQW structure including multiple, alternating well layers of isoelectronically co-doped GaP:N:Bi and barrier layers of GaP.

92. The light-emitting diode of claim 86, including a back contact on the Si substrate and a front contact on the GaP superstrate.

93. The light-emitting diode of claim 92, wherein the front contact is a strip contact on a surface of the GaP superstrate, and wherein the surface of the GaP superstrate is textured.

94. The light-emitting diode of claim 89, wherein the GaP superstrate has a recess in its surface adapted to receive and interface with an optical fiber.

95. The light-emitting diode of claim 94, including an oxidized AlP isolation layer between the distributed Bragg reflector and the first barrier layer.

96. The light-emitting diode of claim 85, wherein the Group III–V semiconductor compound or alloy comprises $Al_xGa_{1-x}P$.

97. The light-emitting diode of claim 96, wherein the $Al_xGa_{1-x}P$ active layer is isoelectronically co-doped with N and Bi to provide a AlGaP:N:Bi crystal lattice.

98. The light-emitting diode of claim 97, wherein the active layer comprises a MQW structure including multiple, alternating well layers of isoelectronically co-doped AlGaP:N:Bi and barrier layers of AlGaP.

99. A thermal voltaic cell, comprising:
an InP substrate with a bandgap of about 1.45 eV; and
a semiconductor cell deposited on the InP substrate, said semiconductor cell comprising InGaAs semiconductor alloy that is isoelectronically co-doped with N deep acceptor atoms and Bi deep donor atoms to provide an InGaAs:N:Bi crystal lattice.

100. The thermal voltaic cell of claim 99, wherein the InGaAs:N:Bi has a bandgap of about 0.5 eV and which is lattice matched to the InP substrate.

101. A GaAs-based laser device, comprising:
an active layer comprising GaAs that is isoelectronically co-doped with an isoelectronic atomic species that creates a deep acceptor in the GaAs and with an isoelectronic atomic species that creates a deep donor; and
a bottom cladding layer and a top cladding layer sandwiching said active layer.

102. The GaAs-based laser device of claim 101, including:
a bottom separate confinement heterostructure disposed between the active layer and the bottom cladding layer; and
a top separate confinement heterostructure disposed between the active layer and the top cladding layer.

103. The GaAs-based laser device of claim 102, wherein the bottom cladding layer comprises GaInP, and the top cladding layer comprises GaInP.

104. The GaAs-based laser device of claim 102, wherein the bottom separate confinement heterostructure comprises GaAs, and the top separate confinement heterostructure comprises GaAs.

105. The GaAs-based laser device of claim 101, wherein the active layer comprises multiple quantum wells of the isoelectronically co-doped GaAs separated by GaAs barriers.

106. The GaAs-based laser device of claim 105, wherein the multiple quantum wells comprise GaAs that is isoelectronically co-doped with N and Bi.

107. The GaAs-based laser device of claim 106, wherein the multiple quantum wells include In in the GaAs that is isoelectronically co-doped with N and Bi to create GaAs:N:Bi:In.

108. The GaAs-based laser device of claim 101, including a GaAs substrate underlaying the bottom cladding layer.

109. The GaAs-based laser device of claim 108, including a bottom contact underlaying the substrate and a top contact overlaying the top cladding layer.

110. The GaAs-based laser device of claim 101, wherein the bottom cladding layer comprises a distributed Bragg reflector stack of alternating GaAs/Al$_x$Ga$_{1-x}$As layers and the top cladding layer comprises a distributed Bragg reflector stack of alternating GaAs/Al$_x$Ga$_{1-x}$As layers.

111. The GaAs-based laser device of claim 110, wherein the distributed Bragg reflector stack of the bottom cladding layer has one of the Al$_x$Ga$_{1-x}$As as layers Al-rich and oxidized from its periphery inwardly toward an unoxidized aperture spaced inwardly from the periphery, and the distributed Bragg reflector stack of the top cladding layer has one of the Al$_x$Ga$_{1-x}$As layers oxidized from its periphery inwardly toward an unoxidized aperture spaced inwardly from the periphery.

112. A laser diode, comprising:
an active region comprising a set of Al$_z$Ga$_{1-z}$P MQW layers that are isoelectronically co-doped with N and Bi to have Al$_z$Ga$_{1-z}$P:N:Bi with lower effective bandgaps than Al$_z$Ga$_{1-z}$P, said MQW layers being separated by barrier layers of Al$_z$Ga$_{1-z}$P, said active region being sandwiched between a bottom SCH layer of GaP and a top SHC layer of GaP;
a bottom cladding layer of group III–V semiconductor compound of alloy underlaying the bottom SCH layer; and
a top cladding layer of Group III–V semiconductor compound or alloy overlaying the top SCH layer.

113. The laser diode of claim 112, wherein the Group III–V semiconductor compound or alloy of the top and bottom cladding layer comprises Al$_x$Ga$_{1-x}$P.

114. The laser diode of claim 113, wherein the bottom cladding layer is joined to a Si substrate.

115. The laser diode of claim 114, wherein the bottom cladding layer is joined to the Si substrate by a series of step-graded layers of GaP$_{1-x-y}$N$_x$Bi$_y$ with the N and Bi for each layer adjusted for desired mismatch strain between adjacent layers to accommodate 0.37% mismatch strain between the Si substrate and the Al$_x$Ga$_{1-x}$P bottom cladding layer.

116. The laser diode of claim 115, wherein the series of step-graded layers comprises four GaP$_{1-x-y}$N$_x$Bi$_y$ layers grown consecutively over the Si substrate with the N and Bi content adjusted in each such that mismatch strain between adjacent layers of GaP$_{1-x-y}$N$_x$Bi$_y$ is about 0.1% for the first three GaP$_{1-x-y}$N$_x$Bi$_y$ layers and about 0.07% between the third and fourth GaP$_{1-x-y}$N$_x$Bi$_y$ layers.

117. The laser diode of claim 116, wherein the isoelectronically co-doped Group III–V semiconductor compound or alloy of the MQW layers comprises GaP:N:Bi:In.

118. The laser diode of claim 117, including a GaP surface passwation layer overlaying the top cladding layer, a top contact attached to the GaP surface passwation layer, and a bottom contact attached to the Si substrate.

119. The laser diode of claim 118, wherein the Si substrate is n-type, the Al$_x$Ga$_{1-x}$P bottom cladding layer is n-type, and the Al$_x$Ga$_{1-x}$P top cladding layer is p-type.

120. The laser diode of claim 119, wherein the bottom SCH layer is n-type and the top SCH layer is p-type.

121. The laser diode of claim 118, wherein the bottom SCH layer comprises graded Al$_x$Ga$_{1-x}$P in which x varies from zero adjacent the active layer to a value adjacent the bottom cladding layer that matches the Al$_x$Ga$_{1-x}$P of the bottom SCH layer adjacent the bottom cladding layer with the Al$_x$Ga$_{1-x}$P of the bottom cladding layer.

122. The laser diode of claim 114, wherein the top cladding layer comprises Al$_x$Ga$_{1-x}$P, and wherein the top SCH layer comprises graded Al$_x$Ga$_{1-x}$P in which x varies from zero adjacent the active layer to a value adjacent the top cladding layer that matches the Al$_x$Ga$_{1-x}$P of the top SCH layer adjacent the top cladding layer with the Al$_x$Ga$_{1-x}$P of the top cladding layer.

123. A photodiode, comprising:
an active junction of Group III–V semiconductor compound or alloy comprising GaAs, which is modified to have a lower effective bandgap by isoelectronically co-doping the Group III–V semiconductor or alloy with sufficient concentrations of N and Bi to produce the lower effective bandgap, and which is fabricated on a substrate of Group III–V semiconductor compound or alloy.

124. The photodiode of claim 123, wherein the isoelectronically co-doped Group III–V semiconductor compound or alloy comprises isoelectronically co-doped GaAs:N:Bi:In.

125. The photodiode of claim 124, wherein the substrate comprises GaAs.

126. A method of modifying a Group III–V semiconductor compound or alloy comprising Ga and As host atoms in a host crystal lattice to have a lower effective bandgap than the semiconductor compound or alloy has prior to modification, comprising:
isoelectronically co-doping the semiconductor compound or alloy with a first isoelectronic dopant comprising atoms that form isoelectronic electron traps in the host crystal lattice that behave as deep acceptors and with a second isoelectronic dopant comprising dopant comprising atoms that form isoelectronic hole traps in the host crystal lattice that behave as deep donors.

127. The method of claim 126, wherein the first isoelectronic dopant comprises Group III atoms.

128. The method of claim 126, wherein the second isoelectronic dopant comprises Group V atoms.

129. The method of claim 126, wherein the first isoelectronic dopant comprises Group V atoms.

130. The method of claim 126, wherein the second isoelectronic dopant comprises Group III atoms.

131. The method of claim 126, wherein the first isoelectronic dopant comprises N and the second isoelectronic dopant comprises Bi.

132. The method of claim 131, wherein content of the N in the semiconductor compound or alloy is more than 3 at. % and content of the Bi in the semiconductor compound alloy is more than 3 at. % of the crystal lattice.

133. A method of modifying a Group III–V semiconductor compound or alloy comprising In and P host atoms in a host crystal lattice to have a lower effective bandgap than the semiconductor compound or alloy has prior to modification, comprising:
isoelectronically co-doping the semiconductor compound or alloy with a first isoelectronic dopant comprising atoms that form isoelectronic electron traps in the host crystal lattice that behave as deep acceptors and with a second isoelectronic dopant comprising atoms that form isoelectronic hole traps in the host crystal lattice that behave as deep donors.

134. The method of claim 133, wherein the first isoelectronic dopant comprises N and the second isoelectronic dopant comprises Bi.

135. The method of claim 134, wherein content of the N in the semiconductor compound or alloy is more than 3 at. % and content of the Bi in the semiconductor compound alloy is more than 3 at. %.

136. A method of modifying a Group III–V semiconductor compound or alloy comprising Al, Ga and P host atoms in a host crystal lattice to have a lower effective bandgap than the semiconductor compound or alloy has prior to modification, comprising:
isoelectronically co-doping the semiconductor compound or alloy with a first isoelectronic dopant comprising atoms that form isoelectronic electron traps in the host crystal lattice that behave as deep acceptors and with a second isoelectronic comprising dopant comprising atoms that form isoelectronic hole traps in the host crystal lattice that behave as deep donors.

137. The method of claim 136, wherein the first isoelectronic dopant comprises N and the second isoelectronic dopant comprises Bi.

138. A method of modifying a Group III–V semiconductor compound or alloy comprising In, Ga, and As host atoms in a host crystal lattice to have a lower effective bandgap than the semiconductor compound or alloy has prior to modification, comprising isoelectronically co-coping the semiconductor or alloy with a first isoelectronic dopant comprising atoms that form isoelectronic electron traps in the host crystal lattice that behave as deep acceptors and with a second isoelectronic dopant comprising atoms that form isoelectronic hole traps in the host crystal lattice that behave as deep donors.

139. The method of claim 138, wherein the first isoelectronic dopant comprises N and the second isoelectronic dopant comprises Bi.

140. A method of modifying a Group II–VI semiconductor compound or alloy comprising host atoms in a host crystal lattice to have a lower effective bandgap than the semiconductor compound or alloy has prior to modification, comprising isoelectronically co-doping the semiconductor or alloy with a first isoelectronic dopant comprising atoms that form isoelectronic electron traps in the host crystal lattice that behave as deep acceptors and with a second isoelectronic dopant comprising atoms that form isoelectronic hole traps in the host crystal lattice that behave as deep donors.

141. The method of claim 140, wherein the first isoelectronic dopant comprises Group VI atoms and the second isoelectronic dopant comprise Group VI atoms.

142. The method of claim 140, wherein the semiconductor alloy comprises Zn and Se host atoms.

143. The method of claim 141, wherein the first isoelectronic dopant comprises O and the second isoelectronic dopant comprises Te.

144. The method of claim 140, wherein the first isoelectronic dopant comprises Group II atoms and the second isoelectronic dopant comprises Group VI atoms.

145. The semiconductor material of claim 28, wherein the first isoelectronic dopant comprises Group V atoms and the second isoelectronic dopant comprises Group III atoms.

146. The semiconductor material of claim 28, wherein the first isoelectronic dopant comprises N and said second isoelectronic dopant comprises Bi.

147. A semiconductor material for use as an active cell in a semiconductor device, comprising:
a Group III–V semiconductor compound or alloy comprising Ga and As host atoms in a host crystal lattice that is isoelectronically co-doped with a first isoelectronic dopant comprising atoms that form isoelectronic traps in the host crystal lattice that behave as deep acceptors, and with a second isoelectronic dopant comprising atoms that form isoelectronic traps in the host crystal lattice that behave as deep donors.

148. The semiconductor material of claim 147, wherein the first isoelectronic dopant comprises N and the second isoelectronic dopant comprises Bi.

149. A semiconductor material for use as an active cell in a semiconductor device, comprising a Group III–V semiconductor compound or alloy comprising In and P host atoms in a host crystal lattice that is isoelectronically co-doped with a first isoelectronic dopant comprising atoms that form isoelectronic traps in the host crystal lattice that behave as deep acceptors, and with a second isoelectronic dopant comprising atoms that form isoelectronic traps in the host crystal lattice that behave as deep donors, and which has an effective bandgap lower than InP.

150. The semiconductor material of claim 149, wherein the first isoelectronic dopant comprises N and the second dopant comprises Bi.

151. A semiconductor material for use as an active cell in a semiconductor device, comprising a Group III–V semiconductor compound or alloy comprising Al, Ga and P host atoms in a host crystal lattice that is isoelectronically co-doped with a first isoelectronic dopant comprising atoms that form isoelectronic traps in the host crystal lattice that behave as deep acceptors, and with a second isoelectronic dopant comprising atoms that form isoelectronic traps in the host crystal lattice that behave as deep donors.

152. The semiconductor material of claim 151, wherein the first isoelectronic dopant comprises N and said second isoelectronic dopant comprises Bi.

153. A semiconductor material for use as an active cell in a semiconductor device, comprising a Group III–V semiconductor compound or alloy comprising In, Ga and As host atoms in a host crystal lattice that is isoelectronically co-doped with a first isoelectronic dopant comprising atoms that form isoelectronic traps in the host crystal lattice that behave as deep acceptors, and with a second isoelectronic dopant comprising atoms that form isoelectronic traps in the host crystal lattice that behave as deep donors.

154. The semiconductor material of claim 153, wherein the first isoelectronic dopant comprises N and said second isoelectronic dopant comprises Bi.

155. A semiconductor material for use as an active cell in a semiconductor device, comprising a Group II–VI semiconductor compound or alloy comprising host atoms in a host crystal lattice that is isoelectronically co-doped with a first isoelectronic dopant comprising atoms that form isoelectronic traps in the host crystal lattice that behave as deep acceptors, and with a second isoelectronic dopant comprising atoms that form isoelectronic traps in the host crystal lattice that behave as deep donors.

156. The semiconductor material of claim 155, wherein the first isoelectronic dopant comprises Group VI atoms and the second isoelectronic dopant comprises Group VI atoms.

157. The semiconductor material of claim 155, wherein the first isoelectronic dopant comprises Group II atoms and the second isoelectronic dopant comprises Group VI atoms.

158. The semiconductor material of claim 155, wherein the Group II and Group VI host atoms comprise Zn and Se.

159. The semiconductor material of claim 155, wherein the first isoelectronic dopant comprises O and the second isoelectronic dopant comprises dopant comprises Te.

160. A method of modifying indirect bandgap GaP to act like a direct bandgap semiconductor material, comprising:
isoelectronically co-doping GaP with N and Bi to form a GaP:N:Bi crystal lattice such that content of the N in the GaP:N:Bi crystal lattice is more than 1 at. % and content of the Bi in the GaP:N:Bi is more than 1 at. %.

161. A light-emitting diode, comprising an active layer of Group III–V semiconductor compound or alloy comprising GaAs that is isoelectronically co-doped with N and Bi, said active layer being sandwiched between: (i) a first barrier layer of the Group III–V semiconductor compound or alloy charged-doped to either n-type of p-type; and (ii) a second barrier layer of the Group III–V semiconductor alloy charged-doped to either n-type or p-type, whichever is opposite the charge-doped first barrier layer.

162. A light-emitting diode, comprising an active layer of Group III–V semiconductor compound or alloy comprising:

InP that is isoelectronically co-doped with a deep acceptor element and a deep donor element to have a lower effective bandgap than InP, said active layer being sandwiched between: (i) a first barrier layer of the Group III–V semiconductor compound or alloy charged-doped to either n-type of p-type; and (ii) a second barrier layer of the Group III–V semiconductor alloy charged-doped to either n-type or p-type, whichever is opposite the charge-doped first barrier layer.

163. A light-emitting diode, comprising an active layer of Group III–V semiconductor compound or alloy comprising:

AlGaP that is isoelectronically co-doped with a deep acceptor element and a deep donor element, said active layer being sandwiched between: (i) a first barrier layer of the Group III–V semiconductor compound or alloy charged-doped to either n-type of p-type; and (ii) a second barrier layer of the Group III–V semiconductor alloy charged-doped to either n-type or p-type, whichever is opposite the charge-doped first barrier layer.

164. A light-emitting diode, comprising an active layer of Group III–V semiconductor compound or alloy comprising:

InGaAs that is isoelectronically co-doped with a deep acceptor element and a deep donor element, said active layer being sandwiched between: (i) a first barrier layer of the Group III–V semiconductor compound or alloy charged-doped to either n-type or p-type; and (ii) a second barrier layer of the Group III–V semiconductor alloy charged-doped to either n-type or p-type, whichever is opposite the charge-doped first barrier layer.

165. A light-emitting diode, comprising an active layer of Group III–V semiconductor compound or alloy comprising:

GaP that is isoelectronically co-doped with at least 1 at. % N and at least 1 at. % Bi, said active layer being sandwiched between: (i) a first barrier layer of the Group III–V semiconductor compound or alloy charged-doped to either n-type or p-type; and (ii) a second barrier layer of the Group III–V semiconductor alloy charged-doped to either n-type or p-type, whichever is opposite the charge-doped first barrier layer.

166. A photodiode, comprising:

an active junction of Group III–V semiconductor compound or alloy comprising AlGaP, which is modified to have a lower effective bandgap by isoelectronically co-doping the Group III–V semiconductor or alloy with sufficient concentrations of N and Bi to produce the lower effective bandgap, and which is fabricated on a substrate of Group III–V semiconductor compound or alloy.

167. A photodiode, comprising:

an active junction of Group III–V semiconductor compound or alloy comprising InGaAs, which is modified to have a lower effective bandgap by isoelectronically co-doping the Group III–V semiconductor or alloy with sufficient concentrations of N and Bi to produce the lower effective bandgap, and which is fabricated on a substrate of Group III–V semiconductor compound or alloy.

168. A photodiode, comprising:

an active junction of Group III–V semiconductor compound or alloy comprising InP, which is modified to have a lower effective bandgap by isoelectronically co-doping the Group III–V semiconductor or alloy with sufficient concentrations of N and Bi to produce the lower effective bandgap, and which is fabricated on a substrate of Group III–V semiconductor compound or alloy.

169. A photodiode, comprising:

an active junction of Group III–V semiconductor compound or alloy comprising GaP, which is modified to have a lower effective bandgap by isoelectronically co-doping the Group III–V semiconductor or alloy with at least 1 at. % N and at least 1 at. % Bi to produce the lower effective bandgap, and which is fabricated on a substrate of Group III–V semiconductor compound or alloy.

* * * * *